(12) United States Patent
Noda et al.

(10) Patent No.: US 10,938,177 B2
(45) Date of Patent: Mar. 2, 2021

(54) TWO-DIMENSIONAL PHOTONIC CRYSTAL SURFACE EMITTING LASER

(71) Applicants: KYOTO UNIVERSITY, Kyoto (JP); ROHM CO., LTD., Kyoto (JP); HAMAMATSU PHOTONICS K.K., Hamamatsu (JP); MITSUBISHI ELECTRIC CORPORATION, Tokyo (JP)

(72) Inventors: Susumu Noda, Kyoto (JP); Hitoshi Kitagawa, Kyoto (JP); Yong Liang, Zurich (CH); Akiyoshi Watanabe, Hamamatsu (JP); Kazuyoshi Hirose, Hamamatsu (JP)

(73) Assignees: KYOTO UNIVERSITY, Kyoto (JP); ROHM CO., LTD., Kyoto (JP); HAMAMATSU PHOTONICS K.K., Hamamatsu (JP); MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/585,948

(22) Filed: Sep. 27, 2019

(65) Prior Publication Data
US 2020/0028327 A1 Jan. 23, 2020

Related U.S. Application Data

(63) Continuation of application No. 15/505,560, filed as application No. PCT/JP2015/074440 on Aug. 28, 2015, now Pat. No. 10,461,501.

(30) Foreign Application Priority Data

Aug. 29, 2014 (JP) .............................. JP2014-175786

(51) Int. Cl.
*H01S 5/042* (2006.01)
*H01S 5/183* (2006.01)

(52) U.S. Cl.
CPC ........ *H01S 5/18319* (2013.01); *H01S 5/0421* (2013.01); *H01S 5/04256* (2019.08); *H01S 5/18338* (2013.01); *H01S 5/18361* (2013.01)

(58) Field of Classification Search
None
See application file for complete search history.

(56) References Cited

U.S. PATENT DOCUMENTS 5,181,220 A * 1/1993 Yagi ........................ H01L 33/20
257/97
5,434,426 A 7/1995 Furuyama et al.
(Continued)

FOREIGN PATENT DOCUMENTS

CN 1855652 A 11/2006
CN 101258652 A 9/2008
(Continued)

OTHER PUBLICATIONS

Kazuyoshi Hirose et al., "Watt-Class High-Power, High-Beam-Quality Photonic-Crystal Lasers" Nature Photonics (UK), 8, pp. 406-411, issued on Apr. 13, 2014.
(Continued)

*Primary Examiner* — Tod T Van Roy
(74) *Attorney, Agent, or Firm* — Oliff PLC

(57) ABSTRACT

To provide a two-dimensional photonic crystal surface emitting laser capable of improving characteristics of light to be emitted, in particular, optical output power. The two-dimensional photonic crystal surface emitting laser includes: a two-dimensional photonic crystal including a plate-shaped base member and modified refractive index regions where the modified refractive index regions have a refractive index
(Continued)

different from that of the plate-shaped base member and are two-dimensionally and periodically arranged in the base member; an active layer provided on one side of the two-dimensional photonic crystal; and a first electrode and a second electrode provided sandwiching the two-dimensional photonic crystal and the active layer for supplying current to the active layer, where the second electrode covers a region equal to or wider than the first electrode.

6 Claims, 15 Drawing Sheets

(56) References Cited

U.S. PATENT DOCUMENTS

| | | | |
|---|---|---|---|
| 5,446,752 A * | 8/1995 | Ackley | H01S 5/18308 |
| | | | 372/46.01 |
| 6,154,480 A | 11/2000 | Magnusson et al. | |
| 6,507,595 B1 | 1/2003 | Kapon et al. | |
| 6,680,965 B2 | 1/2004 | Kinoshita | |
| 8,053,805 B2 | 11/2011 | Lim et al. | |
| 2003/0002146 A1 | 1/2003 | Shimizu | |
| 2005/0023543 A1* | 2/2005 | Konno | H01L 33/387 |
| | | | 257/94 |
| 2005/0089074 A1* | 4/2005 | Koelle | H01S 5/18327 |
| | | | 372/50.1 |
| 2005/0189473 A1 | 9/2005 | Schrodinger | |
| 2006/0140234 A1* | 6/2006 | Kim | H01S 5/141 |
| | | | 372/44.01 |
| 2007/0201527 A1 | 8/2007 | Hori et al. | |
| 2009/0279579 A1 | 11/2009 | Ohnishi et al. | |
| 2010/0103972 A1 | 4/2010 | Saito et al. | |
| 2013/0343415 A1 | 12/2013 | Hori et al. | |
| 2015/0034901 A1 | 2/2015 | Noda et al. | |
| 2017/0338624 A1 | 11/2017 | Takiguchi et al. | |
| 2020/0091681 A1* | 3/2020 | Gerhard | H01S 5/22 |

FOREIGN PATENT DOCUMENTS

| | | |
|---|---|---|
| CN | 101641847 A | 2/2010 |
| CN | 101859983 A | 10/2010 |
| CN | 103038959 A | 4/2013 |
| EP | 1930999 A1 | 6/2008 |
| EP | 2131457 A1 | 12/2009 |
| JP | H08-97505 A | 4/1996 |
| JP | 2002-223033 A | 8/2002 |
| JP | 2003-324234 A | 11/2003 |
| JP | 2007-234824 A | 9/2007 |
| JP | 2009-94317 A | 4/2009 |
| JP | 2012-33748 A | 2/2012 |
| JP | 5177130 B2 | 4/2013 |
| JP | 2013-161965 A | 8/2013 |
| JP | 2014-27264 A | 2/2014 |
| KR | 2008-0049740 A | 6/2008 |
| KR | 2009-0129461 A | 12/2009 |
| WO | 2007/029538 A1 | 3/2007 |
| WO | 2008/117562 A1 | 10/2008 |
| WO | 2013/118358 A1 | 8/2013 |

OTHER PUBLICATIONS

National University Corporation Kyoto University, and Hamamatsu Photonics K.K. "Watt-Class High-Power Photonic-Crystal Lasers: Achieved Leading the World—Watt-Class High Output With High-Beam-Quality Achieved Through Surface Emitting Laser First in the World" [online] National University Corporation Kyoto University's Web Page [retrieved on Aug. 11, 2014], from the Internet<http://www.kyotou.act/ja/news_data/h/h1/news6/2014/documents/140414_1/01.pdf> Apr. 10, 2014.
Nov. 17, 2015 Search Report issued in International Patent Application No. PCT/JP2015/074440.
Nov. 17, 2015 Written Opinion issued in Patent Application No. PCT/JP2015/074440.
Feb. 28, 2017 International Preliminary Report on Patentability issued in International Patent Application No. PCT/JP2015/074440.
Aug. 9, 2018 Office Action issued in Chinese Patent Application No. 201580044945.6.
May 14, 2019 Office Action Issued in Japanese Patent Application No. 2016-545639.
Jun. 3, 2019 Office Action Issued in Chinese Patent Application No. 201580044945.6.

* cited by examiner

Fig. 4
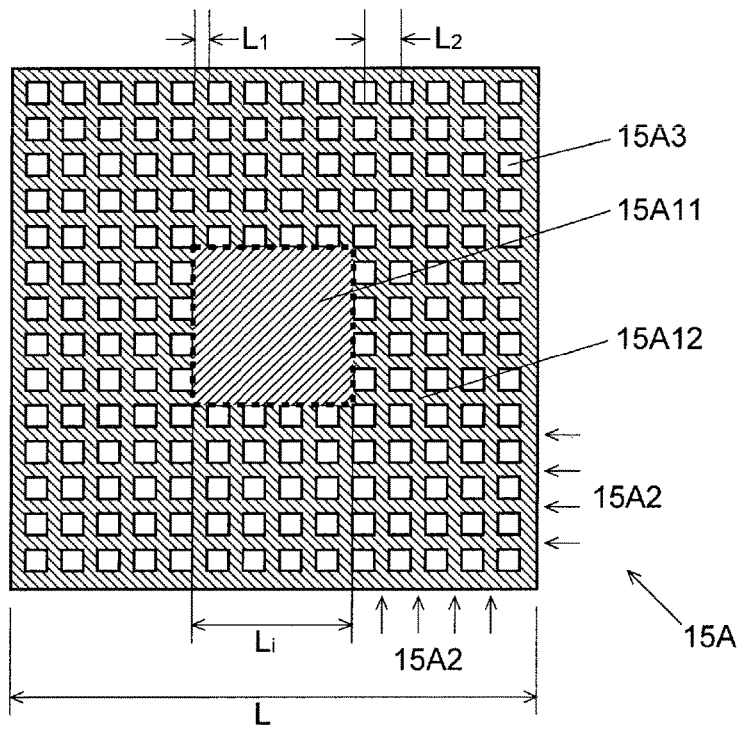
Fig. 5A  CENTRAL PART 111A1
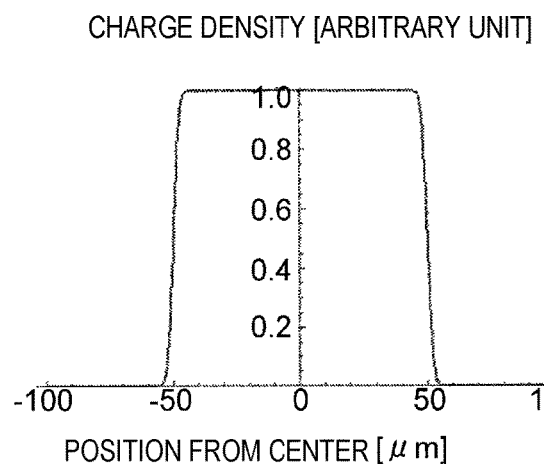
Fig. 5B  PERIPHERAL PART 111A2
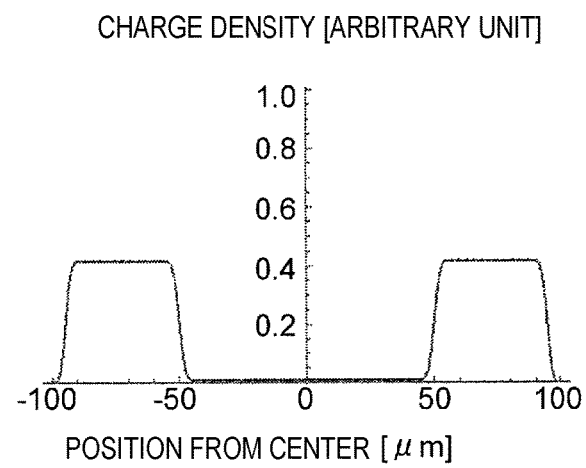

Fig. 8A  L₁=0.50Lc μm、L₂=0.50Lc μm
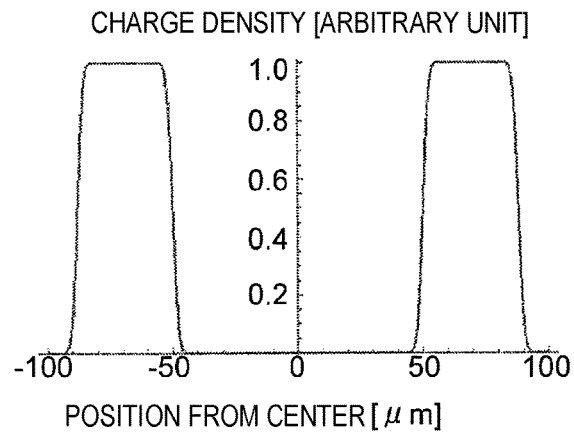
Fig. 8B  L₁=0.50Lc μm、L₂=0.80Lc μm
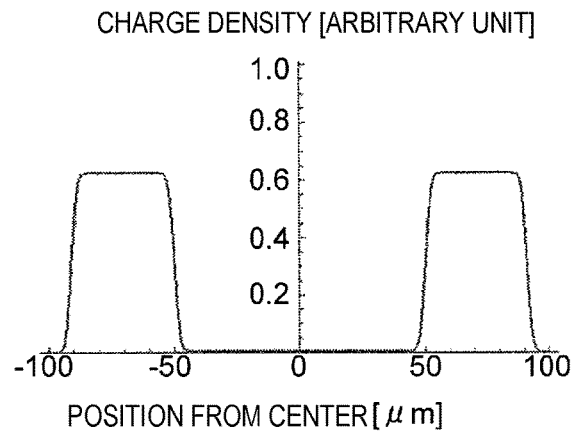
Fig. 8C  L₁=0.50Lc μm、L₂=1.20Lc μm
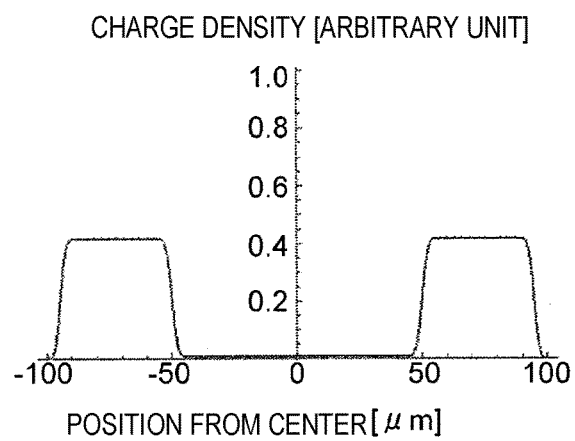
Fig. 8D  L₁=0.50Lc μm、L₂=1.40Lc μm
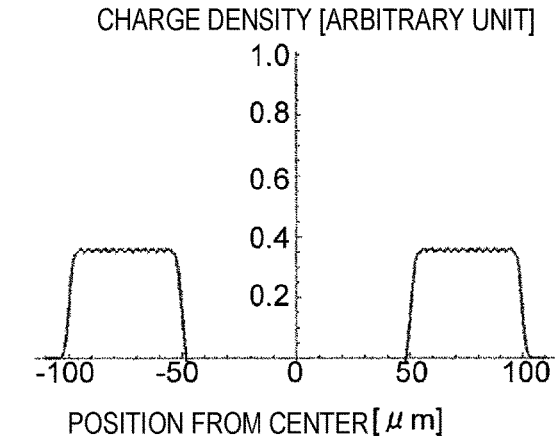
Fig. 8E  L₁=0.50Lc μm、L₂=2.00Lc μm
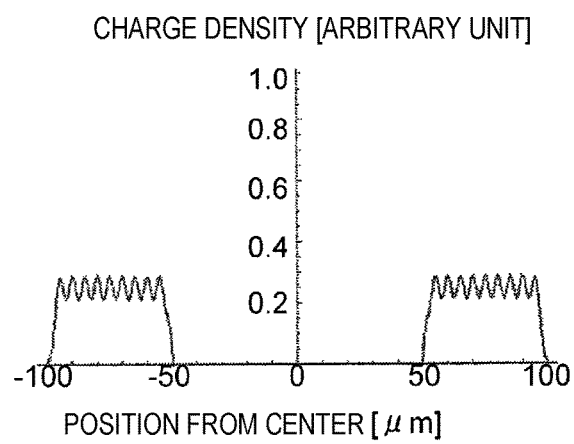

Fig. 9A  $L_1=0.50L_c\mu m$, $L_2=1.20L_c\mu m$
CHARGE DENSITY [ARBITRARY UNIT]
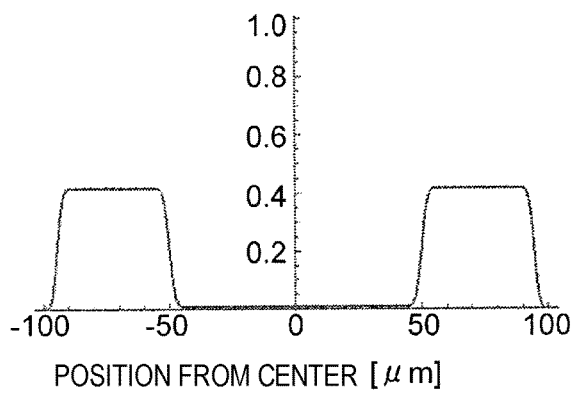
POSITION FROM CENTER [$\mu m$]

Fig. 9B  $L_1=0.32L_c\mu m$, $L_2=1.20L_c\mu m$
CHARGE DENSITY [ARBITRARY UNIT]
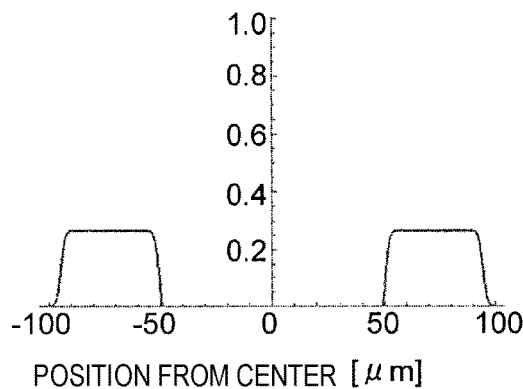
POSITION FROM CENTER [$\mu m$]

Fig. 9C  $L_1=0.20L_c\mu m$, $L_2=1.20L_c\mu m$
CHARGE DENSITY [ARBITRARY UNIT]
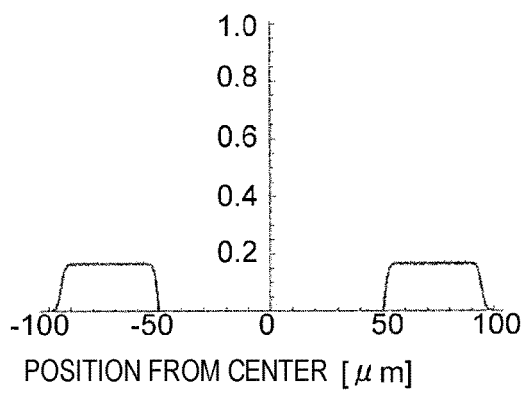
POSITION FROM CENTER [$\mu m$]

Fig. 9D  $L_1=0.16L_c\mu m$, $L_2=1.20L_c\mu m$
CHARGE DENSITY [ARBITRARY UNIT]
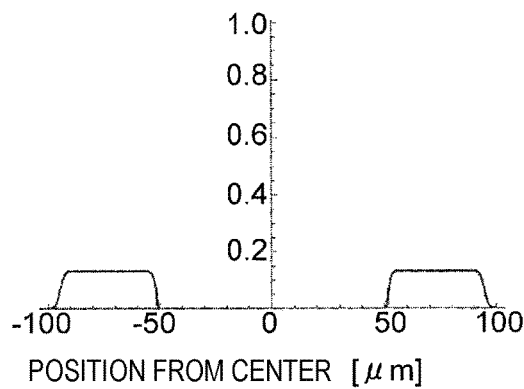
POSITION FROM CENTER [$\mu m$]

Fig. 9E  $L_1=0.12L_c\mu m$, $L_2=1.20L_c\mu m$
CHARGE DENSITY [ARBITRARY UNIT]
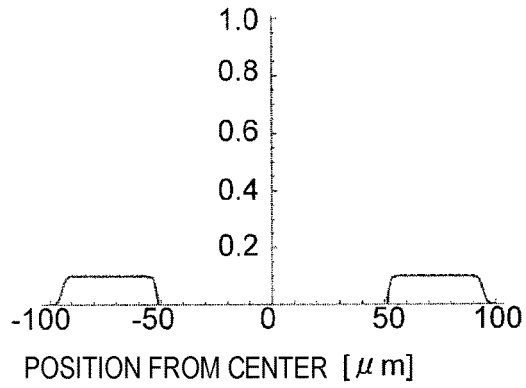
POSITION FROM CENTER [$\mu m$]

Fig. 9F  $L_1=0.08L_c\mu m$, $L_2=1.20L_c\mu m$
CHARGE DENSITY [ARBITRARY UNIT]
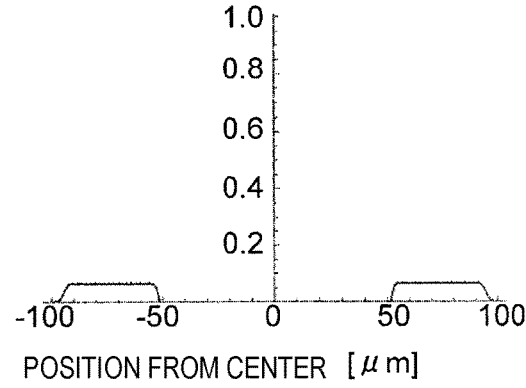
POSITION FROM CENTER [$\mu m$]

TWO-DIMENSIONAL PHOTONIC CRYSTAL SURFACE EMITTING LASER

CROSS-REFERENCE

This is a Continuation-in-part of U.S. application Ser. No. 15/505,560, filed Feb. 21, 2017, which is a National Stage entry of PCT Application No. PCT/JP2015/074440, filed Aug. 28, 2015, and claims priority to Japanese Patent Application No. 2014-175786, filed Aug. 29, 2014. The entire contents of the above applications are expressly incorporated by reference herein.

TECHNICAL FIELD

The present invention relates to a semiconductor laser, and in particular, to a two-dimensional photonic crystal surface emitting laser for amplifying light using a two-dimensional photonic crystal.

BACKGROUND ART

Semiconductor lasers have many advantages, such as small, inexpensive, low power consumption and long service life, and they have been widespread in a wide variety of fields, such as light sources for optical recording, light sources for communication, laser displays, laser printers, and laser pointers. Meanwhile, in the field of laser processing or laser machining, lasers having an optical output power exceeding at least 1 W are required. However, semiconductor lasers currently in actual use do not achieve this output due to the reasons later described. Thus, currently in the laser machining field, gas lasers such as carbon dioxide gas lasers are used instead of semiconductor lasers.

The reason why the optical output powers of semiconductor lasers currently in use are low is as follows. To increase the optical output power of the semiconductor laser, it is preferable that the laser beam emitted from the laser element has a large sectional area (emission area). On the other hand, to increase the machining accuracy, it is preferable that the laser beam to be spotted onto a workpiece has a small sectional area (spot area). Consequently, ideally speaking, it is desirable that the laser beam emitted from a laser source reach the workpiece without broadening. However, in the semiconductor laser, as the emission area increases, the spread angle of the laser beam increases and the wavefront distortion of laser light occurs. If the wavefront distortion of the laser light occurs, it is difficult to obtain a small spot area even when light is focused using an optical system. It is thus difficult for the semiconductor lasers currently in use to achieve the optical output power of 1 W or higher while achieving a small spread angle.

Recently, Noda and Liang among the present inventors have developed a two-dimensional photonic crystal surface emitting laser having the following characteristics: an optical output power of 1.5 W and a beam spread angle of 3° or less (Non-Patent Literatures 1 and 2). The two-dimensional photonic crystal surface emitting laser includes: a two-dimensional photonic crystal including a plate-shaped base member and modified refractive index regions where the modified refractive index regions have a refractive index different from that of the plate-shaped base member and periodically arranged in this member; and an active layer. In the two-dimensional photonic crystal surface emitting laser, when electric current is injected into the active layer, only light having a predetermined wavelength corresponding to the periodicity of modified refractive index regions is amplified among light generated in the active layer, and is caused laser oscillation, whereby a laser beam is emitted in the direction perpendicular to the two-dimensional photonic crystal. The two-dimensional photonic crystal surface emitting laser emits light (surface emission light) from a certain area in the two-dimensional photonic crystal. Consequently, this laser has a larger emission area than that of an end surface emission semiconductor laser, which can enhance the output power and reduce the spread angle. Conventionally, various two-dimensional photonic crystals including modified refractive index regions with different planer shapes (circle, regular triangle, etc.), arrangements (triangular lattice, square lattice, etc.) or other parameters have been known. In the two-dimensional photonic crystal surface emitting lasers described in Non-Patent Literatures 1 and 2, the modified refractive index regions having a planar shape of right triangle are arranged on the lattice points of a square lattice parallel to the orthogonal sides of the modified refractive index region, whereby the optical output power is increased from the conventional two-dimensional photonic crystal surface emitting lasers.

CITATION LIST

Non Patent Literature

[Non Patent Literature 1] Kazuyoshi Hirose and other five authors, "Watt-class high-power, high-beam-quality photonic-crystal lasers", Nature Photonics (UK), 8, pp. 406-411, issued on Apr. 13, 2014.

[Non Patent Literature 2] National university corporation Kyoto University, and Hamamatsu Photonics K.K. "Watt-class high-power photonic-crystal lasers: achieved leading the world—watt-class high output with high-beam-quality achieved through surface emitting laser first in the world" [online] National university corporation Kyoto University's web Page [retrieved on Aug. 11, 2014], from the Internet.

SUMMARY OF INVENTION

Technical Problem

To improve the characteristics of the two-dimensional photonic crystal surface emitting laser, conventional researches have focused only on the configuration of two-dimensional photonic crystals. However, the laser of a semiconductor laser is generated by a cooperating action between light emission from the active layer and amplification in the two-dimensional photonic crystal. Conventionally, no research has focused on this relationship.

An object to be achieved by the present invention is, taking account of the cooperating action between light emission from the active layer and amplification in the two-dimensional photonic crystal, to provide a two-dimensional photonic crystal surface emitting laser that improves the characteristics of light to be emitted, in particular, the output power.

Solution to Problem

The present inventors scrutinized the configuration of an electrode for injecting charges into the active layer in the two-dimensional photonic crystal surface emitting laser. The inventors have found, and achieved the present invention based on, the fact that providing distribution in the charge (carrier) density of the active layer depending on the in-plane position brings about an amplification effect different from that in a case where the charge density of the active layer is uniform in the two-dimensional photonic crystal.

A two-dimensional photonic crystal surface emitting laser according to the present invention aimed at solving the aforementioned problem is a two-dimensional photonic crystal surface emitting laser including:

a two-dimensional photonic crystal including a plate-shaped base member and modified refractive index regions where the modified refractive index regions have a refractive index different from that of the plate-shaped base member and are two-dimensionally and periodically arranged in the base member;

an active layer provided on one side of the two-dimensional photonic crystal; and a first electrode and a second electrode provided sandwiching the two-dimensional photonic crystal and the active layer for supplying current to the active layer, where the second electrode covers a range equal to or wider than the first electrode, wherein the first electrode is formed so as to supply the current to the active layer with a different density depending on an in-plane position on the first electrode.

Typically, in the two-dimensional photonic crystal surface emitting laser, in order to let light out in a plane direction, two electrodes provided sandwiching the two-dimensional photonic crystal and the active layer are formed such that one on a light emission side is made of a transparent electrode and the other is made of a non-transparent (reflective) electrode, or the electrode on the light emission side is formed smaller than the other electrode. The active layer and the two-dimensional photonic crystal are provided in a range equal to or wider than these electrodes (wider than the larger electrode when these electrodes differ in size). Consequently, current (charges) flowing between these electrodes is injected into a partial region of the active layer (hereinafter, called "charge injection region"). In a case where one of the electrodes is smaller than the other electrode, the charge injection region is generally similar to the smaller electrode, depending on the areas of the electrodes and the distance between the electrodes.

In the two-dimensional photonic crystal surface emitting laser according to the present invention, the smaller first electrode (narrower range) supplies the active layer with current having different densities depending on the in-plane position, thereby allowing the charge densities in the charge injection region in the active layer to have different values depending on the in-plane position. Consequently, a distribution of light emission intensities in the active layer is formed depending on the in-plane position. In the two-dimensional photonic crystal, this light emission intensity distribution causes an amplification effect different from that in a case where the charge density in the active layer is uniform.

As one of measures for increasing the optical output power of the two-dimensional photonic crystal surface emitting laser, a configuration where the first electrode is formed so as to supply the current to the active layer where the distribution has a highest density at the center of the in-plane position may be adopted. Consequently, in the charge injection region in the active layer, light emission having the maximum intensity distribution at the center occurs. Amplification of such emitted light in the two-dimensional photonic crystal facilitates laser oscillation in a fundamental mode, and can reduce useless laser oscillation in higher modes. Consequently, the optical output power as a whole can be increased.

Contrary to the aforementioned example, in a case of selectively oscillating laser in the higher modes, current having high density distribution at positions other than the center in the in-plane position on the first electrode may be supplied to the active layer.

To supply the active layer with current having different densities depending on the in-plane position on the first electrode, the first electrode may adopt a configuration where the conductor is formed to have a mesh shape. In the first electrode made of such a mesh-shaped conductor, the thicknesses or intervals of the lines of the mesh, for example, may be set to be different depending on the position to make the conductor area ratio in the meshes to have different values depending on the position. This allows formation of current density distribution depending on the in-plane position on the first electrode.

To form the global current distribution over the entire first electrode by the mesh-shaped first electrode, it is desirable not to form local current distribution depending on the thicknesses and intervals of the lines of mesh. Thus, the intervals between the mesh lines are required to be 1.4 times or less as wide as the current spreading $L_C$ in the active layer. On the other hand, to reduce the current density in a case where the locally periodic distribution of current is permitted, or to form such periodic distribution, the intervals of the mesh lines may be 1.4 times wider or more. Here, the current spreading $L_C$ in the active layer is a value representing the size of a region where current flowing from one point in the first electrode toward the second electrode spreads in the plane of the active layer, and is defined by the distance from the center to the end of the region. The current spreading $L_C$ is substantially equal to the carrier distribution length in the active layer.

The difference in current density depending on the in-plane position in the mesh-shaped first electrode can be formed by a mesh having regions with different area ratios of the conductor in the mesh, for example. In this case, the mesh is formed so as to reduce gradually the area ratio of each of the regions as the position is apart from the center of the in-plane position of the first electrode, thereby causing emission of light having intensity distribution being the maximum at the center in the charge injection region in the active layer. This emission of light is amplified in the two-dimensional photonic crystal, thereby facilitating occurrence of laser oscillation in the fundamental mode. Furthermore, in this case, the region including the center may constitute only of a conductor.

Alternatively, the difference in current density depending on the in-plane position in the mesh-shaped first electrode can be formed by varying the thicknesses and intervals of the mesh lines so as to change continuously the area ratio of the conductor in the mesh depending on the position. In this case, the mesh is formed so as to reduce gradually the area ratio of the conductor in the mesh as the position is apart from the center of the in-plane position of the first electrode, thereby causing emission of light having intensity distribution being the maximum at the center in the charge injection region in the active layer. This emission of light is amplified in the two-dimensional photonic crystal, thereby facilitating occurrence of laser oscillation in the fundamental mode.

In a case of selectively oscillating laser in a higher mode in such a mesh-shaped first electrode, the area ratio of the conductor at a position other than the center of the in-plane position of the first electrode may be set to the maximum.

As another specific form of the first electrode for supplying the active layer with current having densities different depending on the in-plane position, one that includes ring-shaped conductors arranged concentric-circularly, and a connective part for electrically connecting the ring-shaped conductors to each other can be taken. The center of the concentric circles may be a space without the conductor. Alternatively, a non-ring-shaped (typically, circular) conductor may be arranged at the center. In this specific form, by varying the width and/or the interval of the ring-shaped conductors depending on the distance from the center, concentric-circular current density distribution can be formed. To facilitate occurrence of laser oscillation in the fundamental mode, the widths of the ring-shaped conductors may be narrowed and/or the intervals may be broadened as the position is apart from the center of the in-plane position on the first electrode. In a case of selective oscillation of the higher mode, another width and/or interval can be adopted. In a manner similar to that of the intervals between the mesh lines in the mesh-shaped first electrode, it is desirable that the intervals of the ring-shaped conductors be narrow to form a global current distribution over the entire first electrode. To reduce the current density or form local and periodic distribution of current, it is desirable that the interval be wide.

As another specific form of the first electrode for supplying the active layer with current having different densities depending on the in-plane position, a form where the first electrode is divided into regions including sub-electrodes electrically insulated from each other can be taken. In this specific form, power sources different from each other are connected to the respective sub-electrodes, and voltages supplied between the sub-electrodes and the second electrode are adjusted, thereby allowing the current densities in the respective regions to be controlled.

Another aspect of the two-dimensional photonic crystal surface emitting laser according to the present invention includes:

a two-dimensional photonic crystal including a plate-shaped base member and modified refractive index regions where the modified refractive index regions have a refractive index different from that of the plate-shaped base member and are two-dimensionally and periodically arranged in the base member;

an active layer provided on one side of the two-dimensional photonic crystal; and a first electrode and a second electrode provided sandwiching the two-dimensional photonic crystal and the active layer for supplying current through a contact layer having electrical conductivity to the active layer. The first electrode includes:

a central conductor in direct contact with the contact layer, a plurality of ring-shaped conductors in direct contact with the contact layer, the plurality of ring-shaped conductors arranged concentrically around the central conductor, a high resistance portion provided in an inter-conductor region which is composed of a region between the central conductor and a ring-shaped conductor arranged innermost among the plurality of ring-shaped conductors, and a region between adjacent ring-shaped conductors in the plurality of ring-shaped conductors, and a connection conductor at least partially covering the central conductor, the plurality of ring-shaped conductors, and the high resistance portion and provided on an opposite side from the contact layer in the first electrode, so as to electrically connect the central conductor to all the plurality of ring-shaped conductors. The high resistance portion has electrical resistivity higher than electrical resistivities of the central conductor, the plurality of ring-shaped conductors, and the connection conductor.

It is desirable that the connection conductor covers the central conductor, the plurality of ring-shaped conductors, and the high resistance portion in their entirety.

It is desirable that the second electrode is equal to or wider than the first electrode.

The two-dimensional photonic crystal surface emitting laser of this aspect can have a configuration in which, in a region facing the inter-conductor region, the contact layer has a high resistance region having electrical resistivity higher than electrical resistivity of another portion of the contact layer.

In addition, the two-dimensional photonic crystal surface emitting laser of this aspect can have a configuration further including a multilayer reflective film made of two kinds of films alternately stacked with different refractive indexes between the first electrode and the active layer, the multilayer reflective film having electrical conductivity, and can have a configuration in which, in a region facing the inter-conductor region, the multilayer reflective film has a high resistance region having electrical resistivity higher than electrical resistivity of another portion of the multilayer reflective film.

Still another aspect of the two-dimensional photonic crystal surface emitting laser according to the present invention includes:

a two-dimensional photonic crystal including a plate-shaped base member and modified refractive index regions where the modified refractive index regions have a refractive index different from that of the plate-shaped base member and are two-dimensionally and periodically arranged in the base member;

an active layer provided on one side of the two-dimensional photonic crystal; and a first electrode and a second electrode provided sandwiching the two-dimensional photonic crystal and the active layer for supplying current through a contact layer having electrical conductivity to the active layer. The first electrode includes:

a central conductor in direct contact with the contact layer, and a plurality of ring-shaped conductors in direct contact with the contact layer, the plurality of ring-shaped conductors arranged concentrically around the central conductor. The contact layer has a high resistance region having electrical resistivity higher than electrical resistivity of another portion of the contact layer, in a region facing an inter-conductor region which is composed of a region between the central conductor and a ring-shaped conductor arranged innermost among the plurality of ring-shaped conductors, and a region between adjacent ring-shaped conductors in the plurality of ring-shaped conductors.

It is desirable that the second electrode is equal to or wider than the first electrode even in this aspect of the two-dimensional photonic crystal surface emitting laser.

Yet another aspect of the two-dimensional photonic crystal surface emitting laser according to the present invention includes:

a two-dimensional photonic crystal including a plate-shaped base member and modified refractive index regions where the modified refractive index regions have a refractive index different from that of the plate-shaped base member and are two-dimensionally and periodically arranged in the base member;

an active layer provided on one side of the two-dimensional photonic crystal; and a first electrode and a second electrode provided sandwiching the two-dimensional photonic crystal and the active layer for supplying current through a contact layer having electrical conductivity to the active layer. The first electrode includes:

a central conductor in direct contact with the contact layer, and a plurality of ring-shaped conductors in direct contact with the contact layer, the plurality of ring-shaped conductors arranged concentrically around the central conductor. The two-dimensional photonic crystal surface emitting laser of this aspect further includes a multilayer reflective film made of two kinds of films alternately stacked with different refractive indexes between the first electrode and the active layer, the multilayer reflective film having electrical conductivity. The multilayer reflective film has a high resistance region having electrical resistivity higher than electrical resistivity of another portion of the multilayer reflective film, in a region facing an inter-conductor region which is composed of a region between the central conductor and a ring-shaped conductor arranged innermost among the plurality of ring-shaped conductors, and a region between adjacent ring-shaped conductors in the plurality of ring-shaped conductors.

In this aspect of the two-dimensional photonic crystal surface emitting laser, the contact layer may have a high resistance region having electrical resistivity higher than electrical resistivity of another portion of the contact layer, in a region facing the inter-conductor region. It is desirable that the second electrode is equal to or wider than the first electrode even in this aspect of the two-dimensional photonic crystal surface emitting laser.

Advantageous Effects of Invention

According to the present invention, the first electrode is formed so as to supply the active layer with current having different densities depending on the in-plane position, thereby allowing distribution of densities of charges in the charge injection region in the active layer to be formed different depending on the position. This formation can improve the characteristics, particularly the optical output power, of laser light to be amplified in the two-dimensional photonic crystal and be emitted to the outside.

BRIEF DESCRIPTION OF DRAWINGS

FIG. 4 is a plan view showing a configuration of a first electrode in a two-dimensional photonic crystal surface emitting laser of a first embodiment.

FIG. 5A and FIG. 5B are graphs showing charge density distributions of the active layer according to the first embodiment, FIG. 5A shows a central part of the active layer and FIG. 5B shows a peripheral part of the active layer.

FIG. 7A shows the difference depending on the ratio $L_i/L$ of the length $L_i$ of one side of a first conductive region to the length L=200 μm of one side of the first electrode, and FIG. 7B shows the difference depending on L in a case of $L_i/L$=0.5.

FIG. 8A to FIG. 8E are graphs each showing a result of calculating the difference of the charge density distribution of the active layer depending on the interval $L_2$ between mesh lines of the first electrode in the first embodiment.

FIG. 9A to FIG. 9F are graphs each showing a result of calculating the difference of the charge density distribution of the active layer depending on the width $L_1$ of the mesh line of the first electrode in the first embodiment.

FIG. 12A shows the difference depending on the ratio $w_p/L$ of the width $w_p$ of the Gaussian distribution of charge density to the length L=200 μm of one side of the first electrode, and FIG. 12B shows the difference depending on L in a case of $w_p/L$=0.25.

DESCRIPTION OF EMBODIMENTS

Figure 1A:
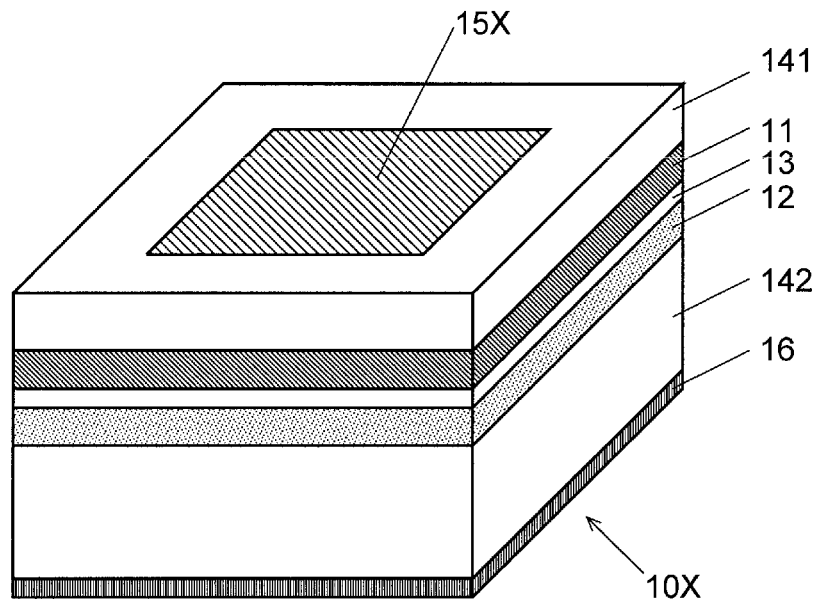
FIG. 1A and FIG. 1B are perspective views showing an embodiment of a two-dimensional photonic crystal surface emitting laser according to the present invention.
Figure 1B:
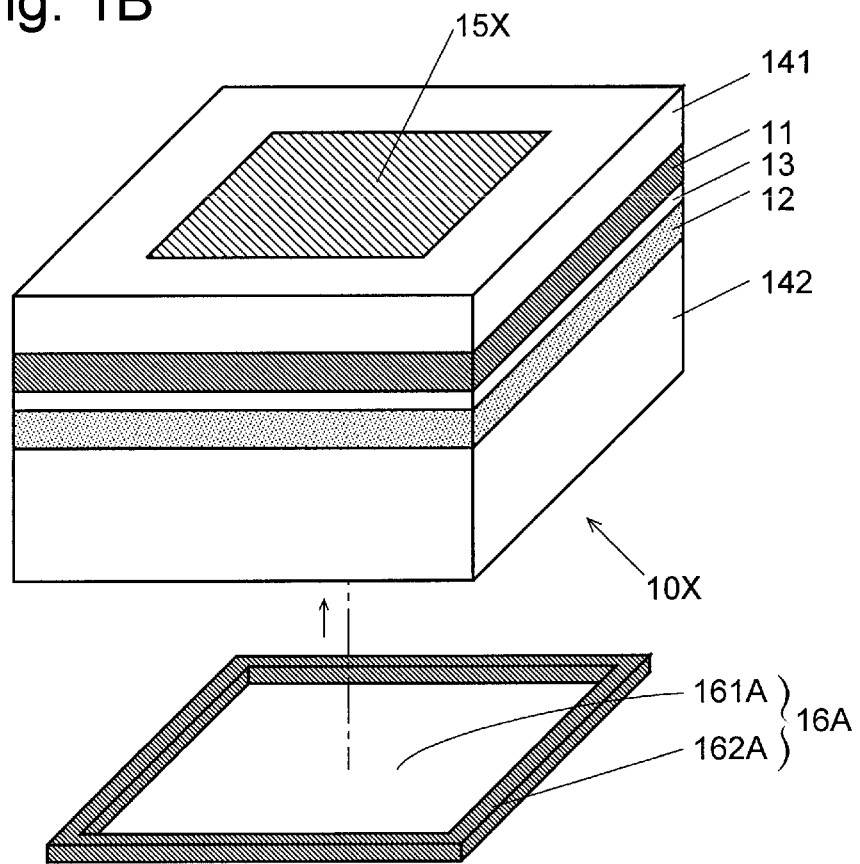

Embodiments of two-dimensional photonic crystal surface emitting lasers according to the present invention are described with reference to FIG. 1 to FIG. 20. Hereinafter, roughly five embodiments are described. First, a configuration common to the embodiments is described. Subsequently, the configurations characteristic to the respective embodiments are described mainly on the configuration of a first electrode.

Embodiments

Configuration Common to Embodiments

A two-dimensional photonic crystal surface emitting laser 10X of each embodiment has a configuration in which a first electrode 15X, a first cladding layer 141, an active layer 11, a spacer layer 13, a two-dimensional photonic crystal layer 12, a second cladding layer 142, and a second electrode 16 are stacked in this order (FIG. 1). The order of the active layer 11 and the two-dimensional photonic crystal layer 12 may be inverted from the above order. For the sake of convenience, FIG. 1 shows the first electrode 15X on the upper side while showing the second electrode 16 on the lower side. However, the orientation of the two-dimensional photonic crystal surface emitting laser 10X of each embodiment in use is not limited to that shown in this diagram. Hereinafter, the configurations of the layers and electrodes are described.

The active layer 11 receives charges injected from the first electrode 15X and the second electrode 16 to emit light having a predetermined wavelength band. As the material of the active layer 11, an InGaAs/AlGaAs multiple-quantum well (light emission wavelength band: 935 to 945 nm) is used in the present embodiment. However, the material is not limited to this in the present invention. The active layer 11 has a square shape with a thickness of approximately 2 μm, and a side of the square has the same length as or a longer than that of the second electrode 16 or 16A described later. The dimension of the active layer 11 is not limited to this in the present invention, and another shape of layer, such as a circular, or hexagonal may be employed.

Figure 2A:
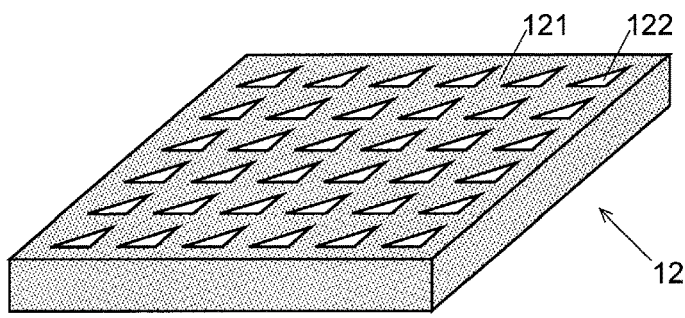
FIG. 2A and FIG. 2B are a perspective view and a plan view respectively showing an example of a two-dimensional photonic crystal in the two-dimensional photonic crystal surface emitting laser of the present embodiment.
Figure 2B:
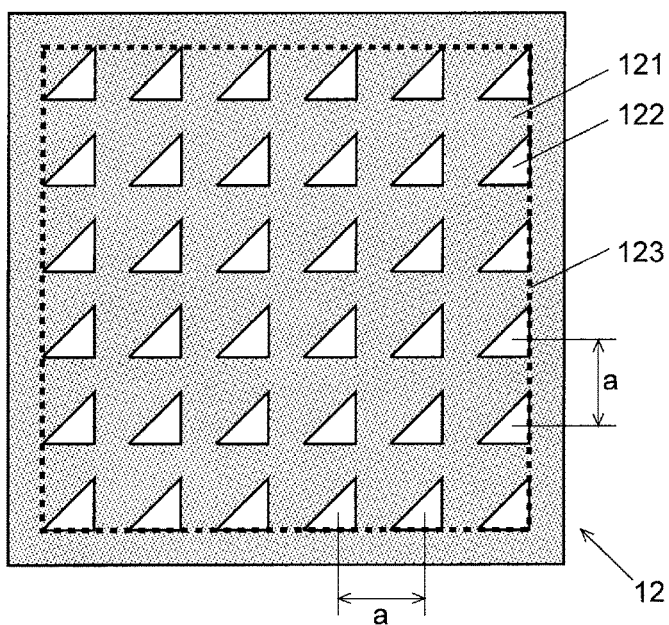

The two-dimensional photonic crystal layer 12 has, for example as shown in FIG. 2, arrangement in which modified refractive index regions 122 having a refractive index different from that of a plate-shaped base member 121 are periodically arranged on the base member 121. The material of the base member 121 is GaAs in the present embodiment, but is not limited to this in the present invention. The modified refractive index regions 122 are air holes (air or vacuum) in the present embodiment. Alternative made of a material (having refractive index) different from that of the base member 121 may be used. In the present embodiment, the modified refractive index regions 122 having a right-triangular plan shape are arranged on the respective lattice points of a square lattice parallel to the orthogonal sides. The lattice constant a of the square lattice was set to 287 nm corresponding to the wavelength in the light emission wavelength band in the active layer 11 in consideration of the refractive index in the two-dimensional photonic crystal layer 12. Alternatively, another configuration may be employed where the planar shapes of the modified refractive index regions 122 are circular, regular-triangular or the like, and the arrangement of the modified refractive index regions 122 is a triangular lattice. The planar shape of the base member 121 is the same as that of the active layer 11, and the thickness is approximately 300 nm. In FIG. 2, vertical six and horizontal six modified refractive index regions 122 are drawn. In actuality, the modified refractive index regions 122 more than those in the diagram are provided.

The spacer layer 13 that is not an essential component in the present invention is provided to connect the active layer 11 and the two-dimensional photonic crystal layer 12 that are made of different materials. The material of the spacer layer 13 is AlGaAs in the present embodiment. However, the material is appropriately changed in accordance with the materials of the active layer 11 and the two-dimensional photonic crystal layer 12.

The first electrode 15X has a configuration specific for each embodiment. The detail of the configuration of the first electrode 15X is described in each embodiment. In FIG. 1, the detailed configuration of the first electrode 15X is eliminated, and only the external shape is drawn. Here, the material and the overall size of the first electrode 15X common to the embodiments are described. The material of the first electrode 15X is a p-type semiconductor in the present embodiment, and is non-transparent for laser light (a wavelength of 940 nm in vacuum in the present embodiment) emitted from the two-dimensional photonic crystal surface emitting laser 10X. The entire of first electrode 15X has a square shape with the length L of one side being approximately 200 μm, and is smaller than the active layer 11 and the two-dimensional photonic crystal 123. Around the first electrode 15X, a reflective layer (not shown) made of metal non-transparent for laser light is provided via an insulator. The reflective layer functions to cooperate with the first electrode 15X so as to reflect laser light generated by the two-dimensional photonic crystal surface emitting laser 10X and to emit the light to the outside from the second electrode 16.

In the example shown in FIG. 1A, the second electrode 16 is made of indium tin oxide (ITO) that is an n-type semiconductor transparent for the laser light. However, the material is not limited to this in the present invention, and indium zinc oxide (IZO) may be used instead, for example. The second electrode 16 has a square shape with each side having a length of approximately 800 μm, and has plan dimension equal to or slightly smaller than those of the active layer 11 and the base member 121 of the two-dimensional photonic crystal layer 12. Instead of adoption of such a transparent electrode, a second electrode 16A shown in FIG. 1B may be used. The second electrode 16A has a configuration with a plate-shaped square member made of metal non-transparent for laser light, and a center part of the member is cut out to form a square shape. The hollow part after cutting the plate-shaped member is called a window 161A, and the remaining plate-shaped member is called a frame 162A. The square of the plate-shaped member (outside of the frame 162A) has a side of 800 μm. The square of the window 161A has a side of 600 μm. In this example, laser light generated by the two-dimensional photonic crystal surface emitting laser 10X passes through the window 161A and is emitted to the outside.

The first cladding layer 141 and the second cladding layer 142 that are not essential components in the present invention function to connect the first electrode 15X and the active layer 11, and the second electrode 16 and the two-dimensional photonic crystal layer 12, respectively, and to facilitate current injection from the first electrode 15X and the second electrode 16 into the active layer 11. To achieve these functions, a p-type semiconductor was used as the material of the first cladding layer 141, and an n-type semiconductor was used as the material of the second cladding layer 142.

Figure 3:
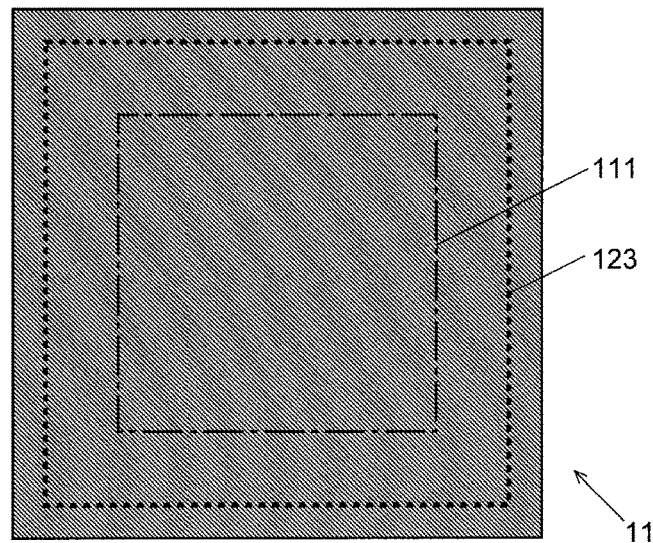
FIG. 3 is a schematic diagram showing a charge injection region in the active layer of the two-dimensional photonic crystal surface emitting laser of the present embodiment in contrast with two-dimensional photonic crystal.
Figure 6:
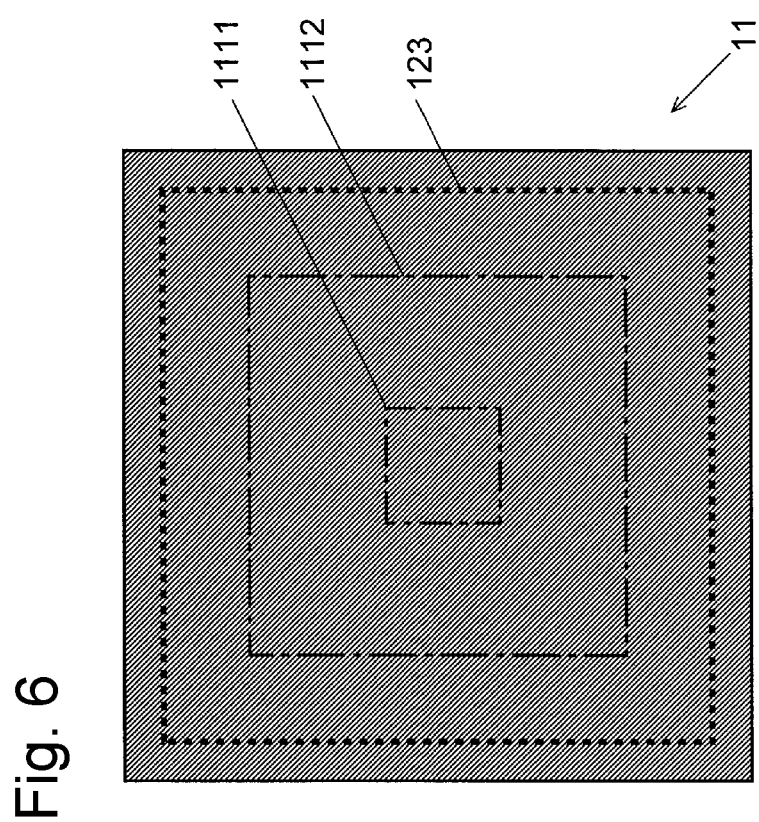
FIG. 6 is a plan view showing the central part and the peripheral part of the active layer in the first embodiment.

The first cladding layer 141 has a two-layer structure consisting of a layer made of p-GaAs and a layer made of p-AlGaAs in order from the first electrode 15X side; likewise, the second cladding layer 142 has a two-layer structure consisting of a layer made of n-GaAs and a layer made of n-AlGaAs in order from the second electrode 16 side (neither of the two-layer structures are not shown). Also as to these first cladding layer 141 and second cladding layer 142, the materials are not limited to the materials described above in the present invention. The plan dimensions of the first cladding layer 141 and the second cladding layer 142 are the same as those of the active layer 11 and the base member 121 of the two-dimensional photonic crystal layer 12. The thickness of the first cladding layer 141 is 2 μm, and the thickness of the second cladding layer 142 is 200 μm. Thus, the active layer 11 is much nearer to the first electrode 15X than the second electrode 16. Accordingly, a charge injection region 111 (FIG. 3) in the active layer 11 has a planar shape and size similar to those of the first electrode 15X. The two-dimensional photonic crystal 123 is larger than the first electrode 15X. Thus, this crystal is larger than the charge injection region 111 of the active layer 11 (FIG. 3).

The operation of the two-dimensional photonic crystal surface emitting laser 10X is described. A predetermined voltage is applied between the first electrode 15X and the second electrode 16. A method of applying the voltage is different depending on the mode of the first electrode 15X of each embodiment, and the detail thereof is described in each embodiment. Through application of the voltage, current from both electrodes are injected into the charge injection region 111 of the active layer 11. Thus, charges are injected into the charge injection region 111 to cause emission of light having a wavelength in a predetermined wavelength band from the charge injection region 111. The charge density distribution and light emission intensity distribution in the charge injection region 111 are described in each embodiment. Among the emission of light thus caused, light having a wavelength corresponding to the lattice constant a of the square lattice is selectively amplified in the two-dimensional photonic crystal 123, and causes laser oscillation. The oscillating laser light is emitted from the second electrode 16 side to the outside.

Hereinafter, each embodiment is described mainly on the characteristic configuration.

First Embodiment—Mesh-Shaped Electrode

In a two-dimensional photonic crystal surface emitting laser of a first embodiment, a first electrode 15A having a configuration shown in FIG. 4 was used. The first electrode 15A has a square shape in an overall view, and includes two regions that are a square-shaped first conductive region 15A11 formed in the vicinity of the center, and a second conductive region 15A12 formed around the first conductive region 15A11. The first conductive region 15A11 is made of a uniform conductor (p-type semiconductor). Meanwhile, the second conductive region 15A12 has a mesh-shaped conductor. Areas between the mesh lines 15A2 are filled with inter-line regions 15A3 made of an insulator. SiN was used as the material of the inter-line regions 15A3. The conductor of the first conductive region 15A11 and the conductor constituting the mesh lines 15A2 in the second conductive region 15A12 are integrally formed and electrically connected to each other and thus equipotential. Such a mesh-shaped electrode can be fabricated using a typical lithography method.

In the present embodiment, the length $L_i$ (one side) of the square that is the plan shape of the first conductive region 15A11 was set to 100 μm. The carrier diffusion length in the active layer 11 is estimated as 2.5 μm by calculation; the size of current spreading $L_C$ is assumed to be substantially the same as the carrier diffusion length, and the interval $L_2$ between the mesh lines 15A2 in the second conductive region 15A12 was set to 3.0 μm, about 1.2 times as wide as the $L_C$. The width $L_1$ of the mesh line 15A2 was set to 1.25 μm.

A result of calculating the charge density distribution formed in the charge injection region 111 of the active layer 11 in the two-dimensional photonic crystal surface emitting laser of the first embodiment is shown in FIG. 5A and FIG. 5B. In the calculation, the current spreading $L_C$ was set to 2.5 μm equal to the carrier distribution length. Thus, the interval $L_2$ between the mesh lines 15A2 is 1.2 times as large as $L_C$. FIG. 5A shows the charge density distribution at a central part 1111 (see FIG. 6) in the charge injection region 111, which corresponds to the first conductive region 15A11, and FIG. 5B shows the charge density distribution in a peripheral part 1112 the same FIG. 6) corresponding to the second conductive region 15A12. In the graphs of FIG. 5A and FIG. 5B, the position of the central part 1111 from the center is taken as the x-axis. The ordinate axis is normalized so that the value of the center (the origin of the x-axis of the graph of FIG. 5A) of the central part 1111 has one. As shown in these graphs, in the central part 1111 and the peripheral part 1112, substantially uniform charge densities are formed. Over the entire charge injection region 111, the charge density distribution where the charge density at the central part 1111 is twice as high as that of the peripheral part 1112 is formed. Formation of such a charge density distribution causes emission of light having the intensity distribution where the maximum is at the central part 1111 in the charge injection region 111. This light emission is amplified in the two-dimensional photonic crystal 123, thereby facilitating laser oscillation in the fundamental mode. This reduces useless laser oscillation in a higher mode, thereby allowing the optical output power to be increased as a whole.

To verify facilitation of laser oscillation in the fundamental mode, the threshold gain difference $\Delta\alpha$ in the first embodiment was obtained by calculation. The threshold gain difference $\Delta\alpha$ has a value obtained by subtracting the threshold gain in the next-higher mode with antinodes and nodes whose numbers are next-smaller than those in the fundamental mode from the threshold gain of the fundamental mode oscillation. The threshold gain in each oscillation mode is a value representing the intensity of laser oscillation in the oscillation mode, and means that the larger the threshold gain difference $\Delta\alpha$, the easier the laser oscillation in the fundamental mode occurs.

First, a result of calculation of the threshold gain difference $\Delta\alpha$ in a case where the length of one side of the first electrode is L=200 μm as described above and $L_i$ has different values in a range of 0 to 200 μm including 100 μm described above is shown in a graph of FIG. 7A. The abscissa axis of this graph is indicated as $L_i/L$. In the graph, the data of $L_i/L$=1 is not in the present embodiment but in a conventional two-dimensional photonic crystal laser with the first electrode made of a uniform conductive plate uniform as a whole. The data of $L_i/L$=0 shows that the first electrode is made of a mesh-shaped electrode with a uniform conductor density. According to this graph, it can be understood that in the case with the first conductive region made of the uniform conductor and the mesh-shaped second conductive region and $L_i/L\neq$0 and 1, the threshold gain difference $\Delta\alpha$ is larger than the conventional case with $L_i/L=1$ and laser oscillation in the fundamental mode easily occurs. In the data shown in FIG. 7A, in a case with $L_i/L=0.5$, that is, the aforementioned case with $L_i=100$ μm and $L=200$ μm, the threshold gain difference $\Delta\alpha$ is the largest.

Figure 7A:
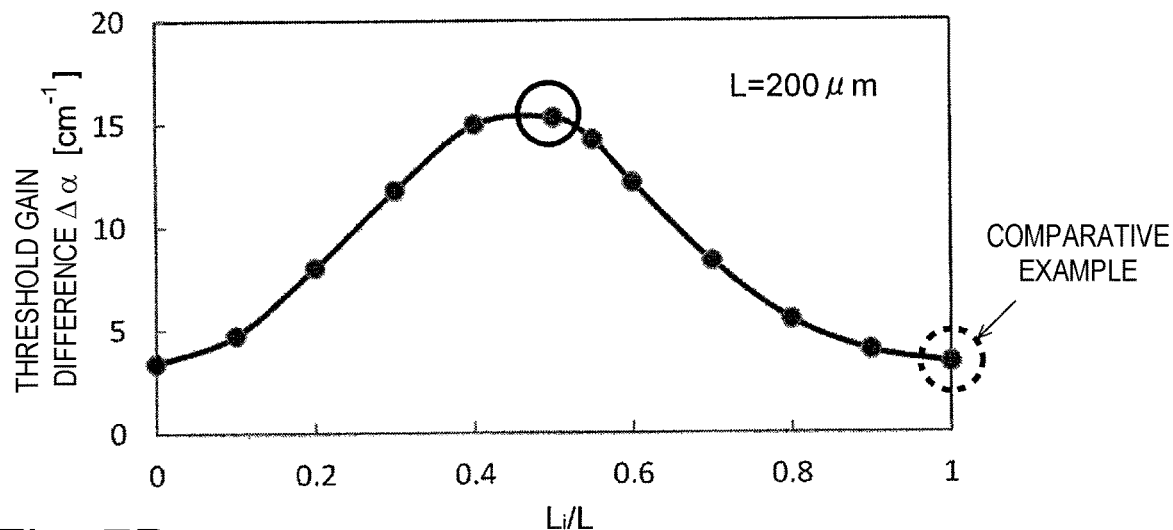
FIG. 7A and FIG. 7B are graphs showing results of calculating threshold gain differences Δα in the first embodiment.
Figure 7B:
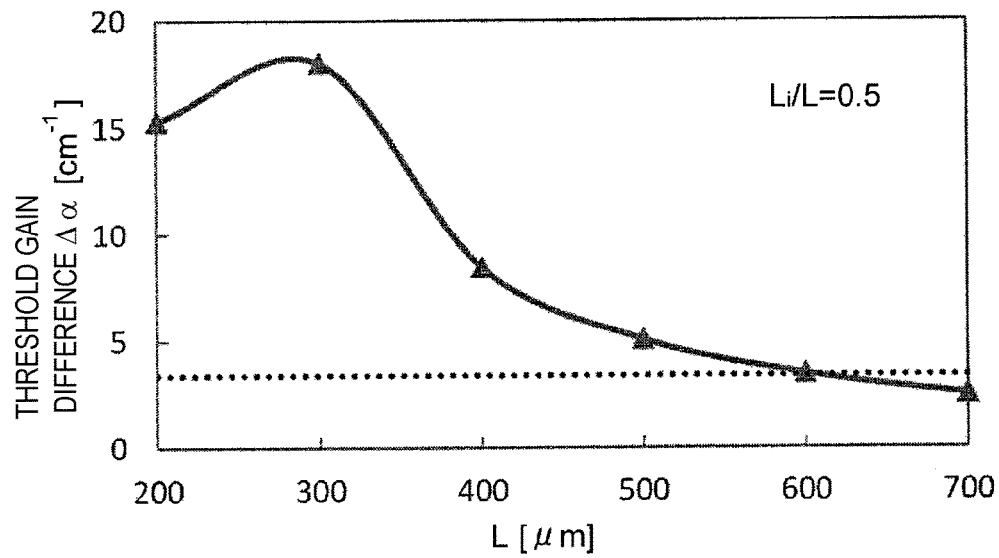

Next, a result of calculating the threshold gain difference $\Delta\alpha$ in a case with $L_i/L$ of 0.5 and L of different values is shown in the graph of FIG. 7B. According to this graph, in a range larger than L of 300 μm, the larger the L is, the smaller the threshold gain difference $\Delta\alpha$ is. Meanwhile, the larger the L is, the larger the area of the entire first electrode is. Consequently, it is advantageous in view of achieving a high laser output. Based on the calculated values of $\Delta\alpha$ obtained in FIG. 7B, when laser light output power was calculated in a case of the highest L with $L=600$ μm ($L_i=300$ μm) among values of $\Delta\alpha$ equal to or larger than the value of $\Delta\alpha$ in the conventional example ($L_i/L=1$) in FIG. 7A, a value of 2.4 W was obtained. This calculated value of optical output power is higher than experiment values of the two-dimensional photonic crystal lasers described in Non-Patent Literatures 1 and 2 (albeit differences between the calculated value and the experiment values reside).

The case where the interval $L_2$ between the mesh lines 15A2 in the second conductive region 15A12 of the first electrode 15A is 3.0 μm has heretofore been described. Results of calculating the charge density in the peripheral part 1112 in the active layer 11 in examples with different intervals $L_2$ are shown in FIG. 8A to FIG. 8E. The width $L_1$ of each mesh line 15A2 was set to 0.50 $L_c$μm. The interval $L_2$ was set to 0.50 $L_c$μm in FIG. 8A, 0.80 $L_c$μm in FIG. 8B, 1.20 $L_c$μm in FIG. 8C (thus, FIG. 8C is a reproduction of FIG. 5B), 1.40 $L_c$μm in FIG. 8D, and 2.00 $L_c$μm in FIG. 8E. According to these calculations, the charge density distribution in the peripheral part 1112 is almost uniform in the cases of FIG. 8A to FIG. 8C, while a slight periodical fluctuation corresponding to the period of the mesh lines 15A2 is shown but the fluctuation width is confined to be less than 5% in the case of FIG. 8D. On the contrary, in the case of FIG. 8E with the interval $L_2$ 1.4 times wider than the current spreading $L_C$, the width of periodical fluctuation of charge density distribution is large, exceeding 10%. In the case where the widths $L_1$ of the mesh lines 15A2 are the same, the larger the interval $L_2$ is, the lower the charge density is.

FIG. 9A to FIG. 9F each show a result of calculating the charge density in the peripheral part 1112 in the active layer 11 in examples with different widths $L_1$ for in the case where the intervals $L_2$ of the mesh lines 15A2 are the same. The interval $L_2$ between the mesh lines 15A2 was set to 1.20 $L_c$μm. The width $L_1$ was set to 0.50 $L_c$μm in FIG. 9A (thus, FIG. 9A is a reproduction of FIG. 5B and FIG. 8C), 0.32 $L_c$μm in FIG. 9B, 0.20 $L_c$μm in FIG. 9C, 0.16 $L_c$μm in FIG. 9D, 0.12 $L_c$μm in FIG. 9E, and 0.08 $L_c$μm in FIG. 9F. According to these calculations, in the charge density distribution in the peripheral part 1112, the smaller the width $L_1$ of the mesh line 15A2 is, the lower the charge density is.

As described above, when giving the difference in the intervals $L_2$ and/or widths $L_1$ of the mesh lines 15A2 in the first electrode 15A, the lower the area ratio of the conductor (line) in the meshes is, the lower the charge density is. Therefore, by setting these interval $L_2$ and/or width $L_1$, the charge density at the corresponding position in the active layer 11 can be defined.

Figure 10A:
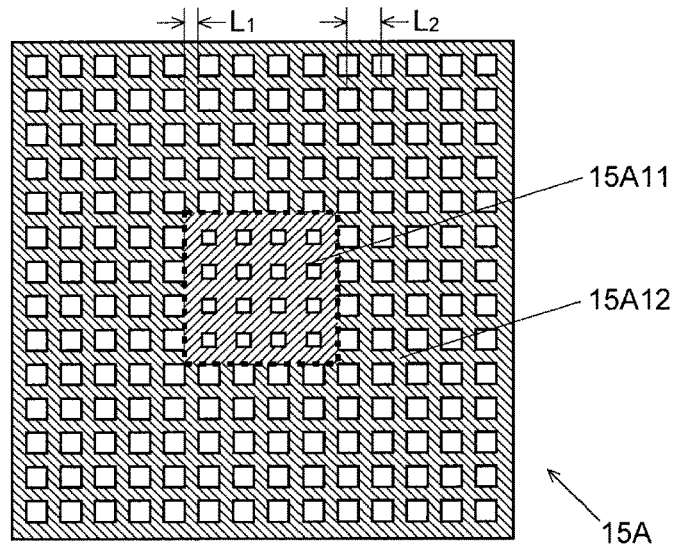
FIG. 10A to FIG. 10C are plan views showing three modified examples of first electrodes in the first embodiment.
Figure 10B:
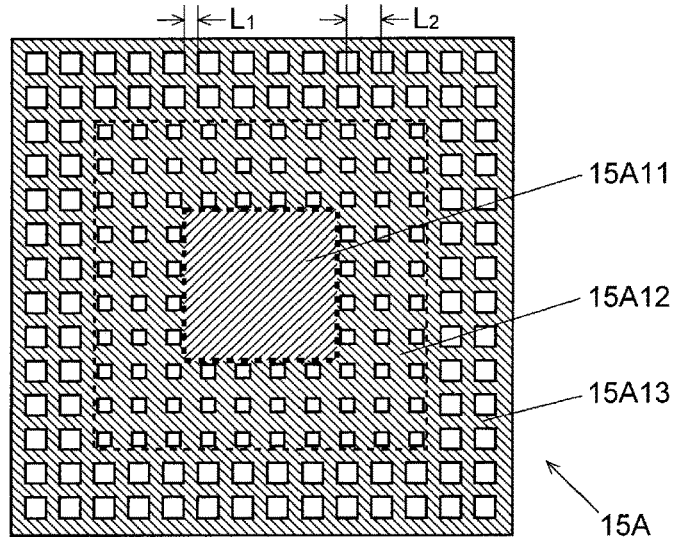
Figure 10C:
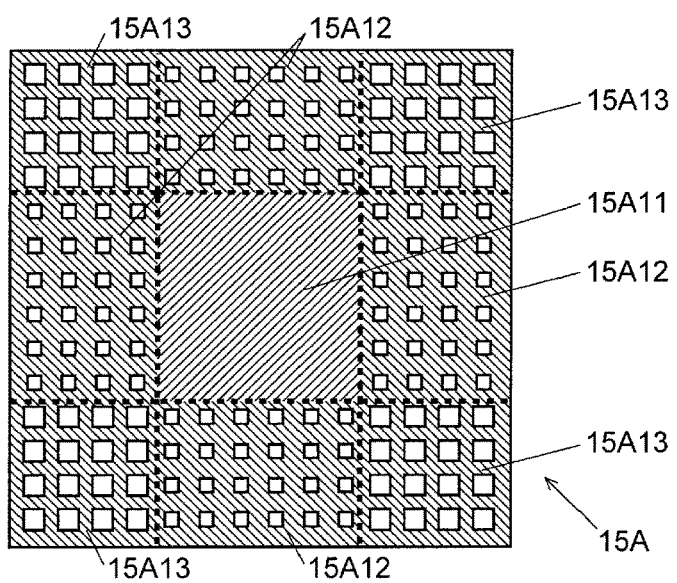

Instead of the unique conductor in the aforementioned example, the first conductive region 15A11 may be made of a mesh having a larger conductor area ratio than the second conductive region 15A12, for example, having the larger width $L_1$ of the mesh line than the second conductive region 15A12 (FIG. 10A) or having the same width $L_1$ but the smaller width $L_2$. Alternatively, three or more conductive regions (first conductive region 15A11, second conductive region 15A12, third conductive region 15A13 . . . ) may be provided so as to have the conductor area ratio gradually reducing from the center to the periphery of the first electrode 15A (FIG. 10B). As another example, a configuration may be provided in which a square-shaped first conductive region 15A11 having the highest conductor area ratio is provided at the center of a first electrode 15A, a second conductive region 15A12 having the next-highest conductor area ratio is provided in contact with the sides of the square of the first conductive region 15A11, and a third conductive region 15A13 having a lower conductor area ratio than the these two conductive regions is provided in contact with the vertexes of the square of the first conductive region 15A11 (FIG. 10C).

Figure 11:
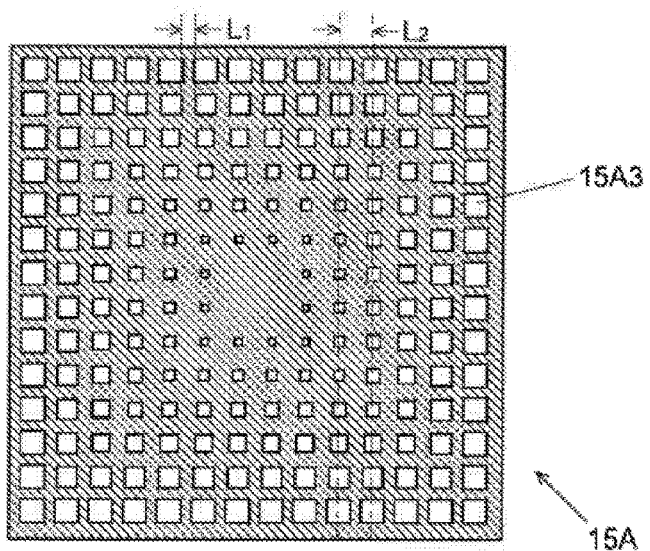
FIG. 11 is a plan view showing another modified example of the first electrode in the first embodiment.

As shown in FIG. 11, from the center of the in-plane position of the first electrode 15A toward the outside, the area of each inter-line region 15A3 may gradually increase. In this example, the intervals $L_2$ between the mesh lines 15A2 have the same value irrespective of the in-plane position, and the width $L_1$ continuously varies so as to decrease gradually as the position is apart from the center of the in-plane position. At the center of the in-plane position, the width $L_1$ is the same as the interval $L_2$, and the inter-line regions 15A3 is not provided. According to the configuration, the conductor area ratio in the first electrode 15A substantially continuously changes so as to decrease gradually as the position is apart from the center of the in-plane position. In the charge injection region 111 of the active layer 11 into which current is injected from such a first electrode 15A, the charge density decreasing gradually from the center of the in-plane position toward the outside is formed; likewise, the intensity of light emission gradually decreases from the center of the in-plane position toward the outside. Such intensity distribution according to the position of light emission is more similar to the Gaussian distribution than the distribution in the other cases exemplified above. Consequently, laser oscillation in the fundamental mode easily occurs.

Figure 12A:
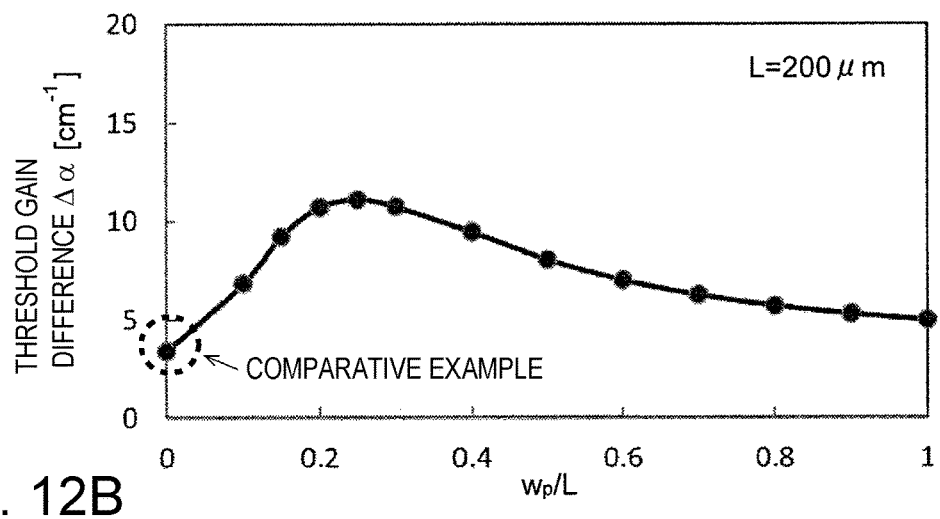
FIG. 12A and FIG. 12B are graphs showing results of calculating threshold gain difference Δα in the example of FIG. 11.
Figure 12B:
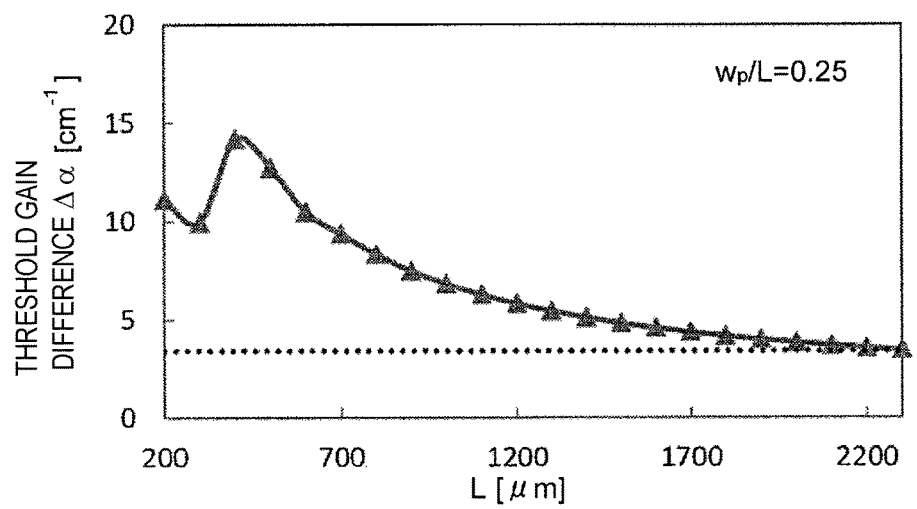

FIG. 12A and FIG. 12B each show, in a graph, a result of calculating the threshold gain difference $\Delta\alpha$ in the example of FIG. 11. It is herein assumed that the Gaussian distribution of the charge density having the width $w_p$ is formed in the charge injection region 111. In FIG. 12A, L was fixed to 200 μm, and $w_p/L$ was adopted as the abscissa axis of the graph. In FIG. 12B, $w_p/L$ was fixed to 0.25, and L was adopted as the abscissa axis. In FIG. 12A, data with $w_p/L=0$ is not that in the present embodiment, but is that of the conventional two-dimensional photonic crystal laser where uniform charge distribution is formed in the active layer by the plate-shaped first electrode. It can be understood that the entire data in the present embodiment shown in FIG. 12A has a larger threshold gain difference $\Delta\alpha$ than the conventional case with $w_p/L=0$, and laser oscillation in the fundamental mode easily occurs. According to the graph of FIG. 12B, in a range with the value of L longer than 400 μm, the longer L is, the smaller the threshold gain difference $\Delta\alpha$ is. Meanwhile, the longer L is, the larger the area of the entire first electrode is. Thus, it is advantageous in view of increasing laser output. Based on the calculated values of $\Delta\alpha$ obtained in FIG. 12B, when laser light output power was calculated in a case of the largest L with $L=2200$ μm among values of $\Delta\alpha$ equal to or larger than the value of $\Delta\alpha$ in the conventional example in FIG. 12A, a value of 8 W was obtained. The calculated value of the optical output power is higher than the calculated value in a case where the charge density is adjusted only by two values using the aforementioned first conductive region 15A11 and second conductive region 15A12.

Figure 13:
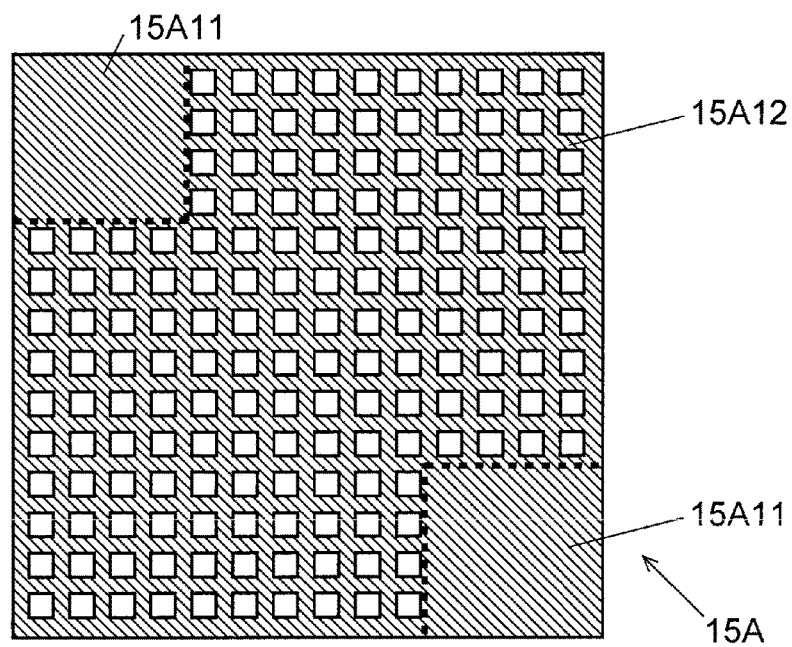
FIG. 13 is a plan view showing another modified example of the first electrode in the first embodiment.

FIG. 13 shows an example of the first electrode 15A for selectively oscillating laser in a higher mode. In this example, in the square-shaped first electrode 15A, first conductive regions 15A11 were provided in the vicinity of the two vertexes on one diagonal line among the four vertexes of the square, and the remaining region was set to a second conductive region 15A12 having a lower conductor area ratio than the first conductive regions 15A11 do. This structure forms distribution where the current density is low in the vicinity of the center of the planar shape of the first electrode 15A, and the current density is high in the vicinity of the two vertexes. Injection of the current with such distribution into the active layer 11 causes light generated in the active layer 11 to become standing waves in the higher mode where a node is in the vicinity of the center and the anti-nodes are in the vicinity of the position corresponding to the two vertexes on the diagonal line in the two-dimensional photonic crystal 123. Consequently, laser in the higher mode oscillates.

Second Embodiment—Concentric-Circular Electrode

Figure 14:
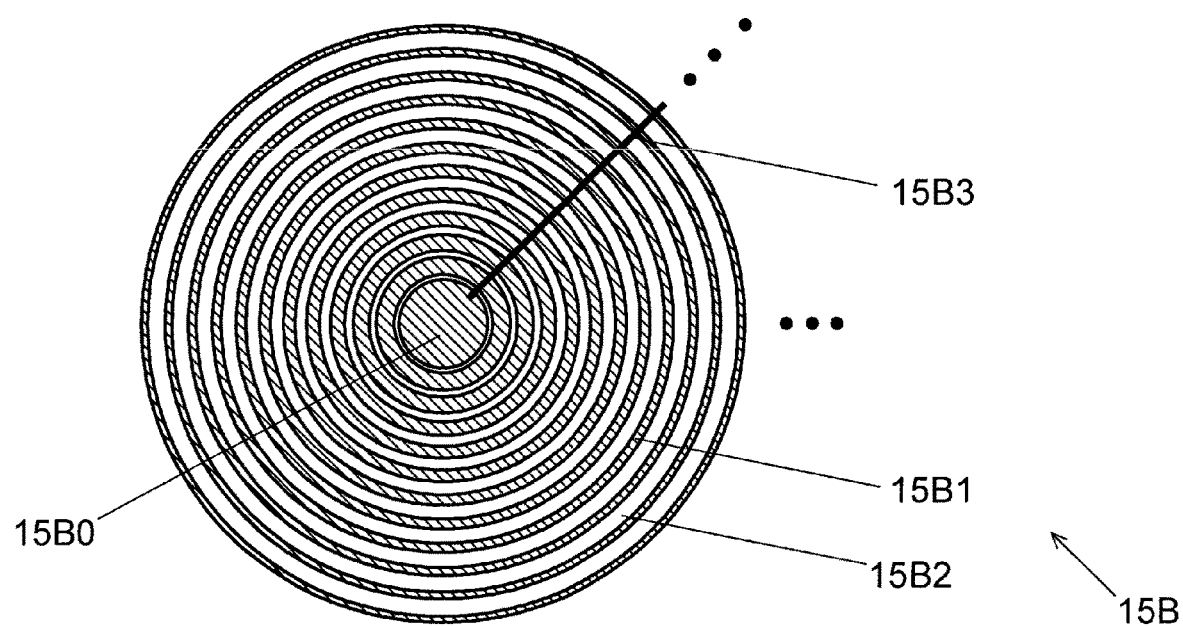
FIG. 14 is a plan view showing a configuration of a first electrode in a two-dimensional photonic crystal surface emitting laser of a second embodiment.

A two-dimensional photonic crystal surface emitting laser of a second embodiment uses a first electrode 15B having a configuration where ring-shaped conductors 15B1 are provided in a concentric manner, and the boundaries of the ring-shaped conductors 15B1 are insulated from each other with ring-shaped insulators 15B2 as shown in FIG. 14. A circular conductor 15B0 is provided at the center of the concentric circle. The circular conductor 15B0 and the ring-shaped conductors 15B1 are electrically connected to each other with a linear conductor 15B3. The width of the ring-shaped conductor 15B1 was set to have a ratio to the width of the ring-shaped insulator 15B2 being lower as apart from the center. Consequently, current density distribution where the density decreases as the position is apart from the center of the first electrode 15B is formed.

Third Embodiment—Divided Electrodes

Figure 15:
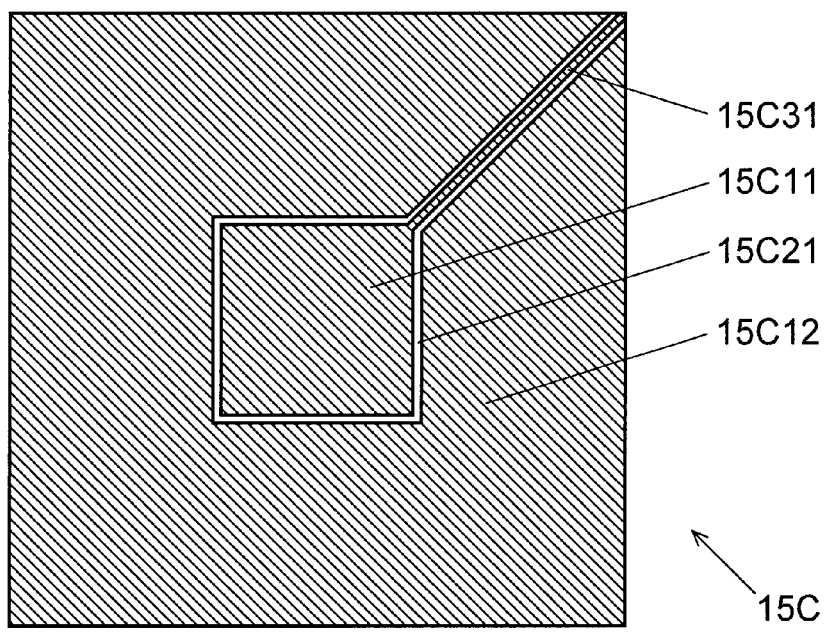
FIG. 15 is a plan view showing a configuration of a first electrode in a two-dimensional photonic crystal surface emitting laser of a third embodiment.

In a two-dimensional photonic crystal surface emitting laser of a third embodiment, a first electrode 15C having a configuration shown in FIG. 15 was used. A first electrode 15C has a square shape in an overall view, and includes two regions that are a square-shaped first conductive region 15C11 formed in the vicinity of the center, and a second conductive region 15C12 formed around the first conductive region 15C11. An insulative region 15C21 made of an insulator linearly formed as with the four sides of a square is provided at the boundary between the first conductive region 15C11 and the second conductive region 15C12. In this structure, the first conductive region 15C11 and the second conductive region 15C12 function as the aforementioned sub-electrodes. The first electrode 15C includes a linear connective region 15C31 made of a conductor, extending from one vertex of the square of the first conductive region 15C11 on the diagonal line of the square of the second conductive region 15C12 and reaching one vertex of the second conductive region 15C12. An insulative region 15C21 is provided on both sides of the line of the connective region 15C31. The first electrode 15C can be fabricated using a typical lithography method.

The two-dimensional photonic crystal surface emitting laser of the third embodiment applies a first voltage $V_1$ between the first conductive region 15C11 and the second electrode 16 while applying a second voltage $V_2$ lower than the first voltage $V_1$ between the second conductive region 15C12 and the second electrode 16. During the application, the first conductive region 15C11 is connected with a first power source (not shown) via the connective region 15C31 while the second conductive region 15C12 is directly connected with a second power source (not shown) other than the first power source. The first conductive region 15C11 and the second conductive region 15C12 are electrically separated from each other by the insulative region 15C21 as described above. Thus, different voltages can be applied to the respective regions. Such voltage application forms charge density distribution with the density higher at the central part 1111 than that at the peripheral part 1112 in the charge injection region 111 of the active layer 11. Therefore emission of light having intensity distribution in which the intensity is maximum at the central part 1111 occurs from the charge injection region 111. This emitted light is amplified in the two-dimensional photonic crystal 123 to facilitate laser oscillation in a fundamental mode. Consequently, useless laser oscillation in a higher mode can be reduced, thereby allowing the optical output power to be increased as a whole.

Figure 16:
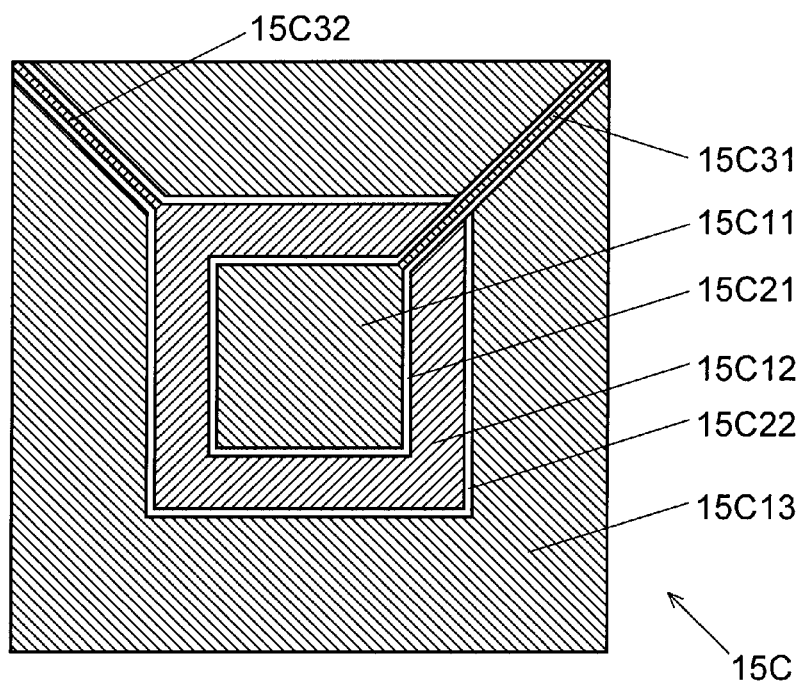
FIG. 16 is a plan view showing a modified example of the first electrode in the two-dimensional photonic crystal surface emitting laser of the third embodiment.

The first electrode 15C of the third embodiment may include three or more conductive regions (the first conductive region 15C11, second conductive region 15C12, third conductive region 15C13 . . . ) from the center toward the periphery (FIG. 16). In the case of providing three or more conductive regions, all the boundaries between the conductive regions are provided with insulative regions 15C21, 15C22 . . . . In conductive regions other than the conductive region residing at the outermost, connective regions 15C31 and 15C32 . . . are provided. The conductive regions (sub-electrodes) are connected with different power sources.

Fourth Embodiment—Concentric-Circular Electrode 2

Figure 17A:
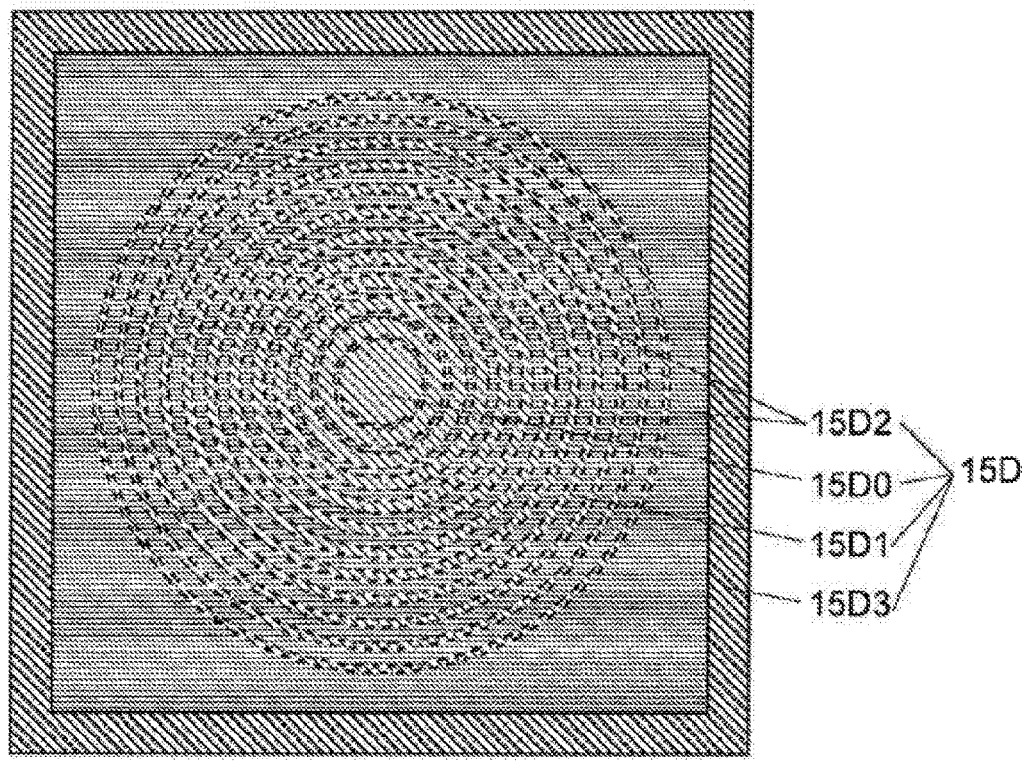
FIG. 17A is a plan view showing a configuration of a first electrode in a two-dimensional photonic crystal surface emitting laser of a fourth embodiment.
Figure 17B:
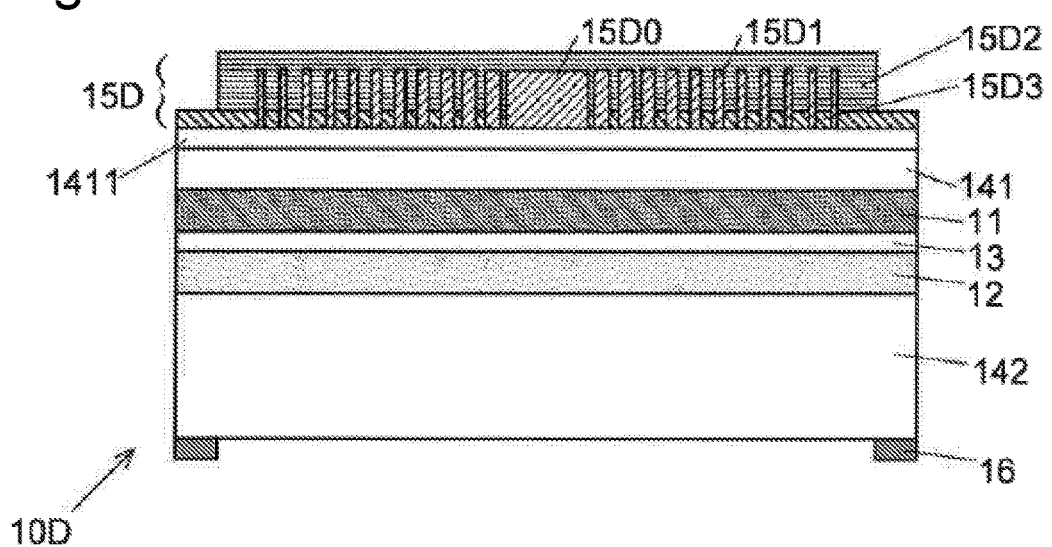
FIG. 17B is a sectional view showing the configuration of the first electrode in the two-dimensional photonic crystal surface emitting laser of the fourth embodiment.

As shown in FIGS. 17A and 17B, the two-dimensional photonic crystal surface emitting laser 10D of the fourth embodiment has a configuration in which a first electrode 15D, a contact layer 1411, a first cladding layer 141, an active layer 11, a spacer layer 13, a two-dimensional photonic crystal layer 12, a second cladding layer 142, and a second electrode 16 are stacked in this order. Of these layers, the contact layer 1411 is a layer made of p-GaAs, and the first cladding layer 141 has a single-layer structure of a layer made of p-AlGaAs. The configuration other than the contact layer 1411, the first cladding layer 141, and the first electrode 15D to be described later is the same as that of the two-dimensional photonic crystal surface emitting laser of the first embodiment.

The first electrode 15D includes a central conductor 15D0, a ring-shaped conductor 15D1, a connection conductor 15D2, and an insulating film (high resistance portion) 15D3 made of an insulator. The central conductor 15D0 has a circular shape in a plan view and the inside is filled with a conductive material. The ring-shaped conductor 15D1 has an annular shape in a plan view, and a plurality of ring-shaped conductors 15D1 are concentrically provided around the central conductor 15D0. The central conductor 15D0 and the ring-shaped conductors 15D1 are in electrical contact with the contact layer 1411.

Insulating films 15D3 are provided in the region between the central conductor 15D0 and the ring-shaped conductor 15D1 arranged innermost and in the regions between adjacent ring-shaped conductors 15D1 (these regions are referred to as "inter-conductor regions"). In addition, on the opposite side from the contact layer 1411 in the first electrode 15D, a connection conductor 15D2 covering the central conductor 15D0, the plurality of ring-shaped conductors 15D1, and the insulating films 15D3 in their entirety is provided. With this configuration, the central conductor 15D0 and the plurality of ring-shaped conductors 15D1 are electrically connected to each other by the connection conductor 15D2. The ratio of the width of each ring-shaped conductor 15D1 to the width of the inter-conductor region decreases as the distance from the central conductor 15D0 increases.

In the present example, the insulating film 15D3 and the connection conductor 15D2 are provided in a portion outside the ring-shaped conductor 15D1 arranged outermost, but there is no need to provide the insulating film 15D3 and the connection conductor 15D2 in this portion. In addition, although the case where the insulating film 15D3 is used as the high resistance portion is described, the connection conductor 15D2 has only to be in electrical non-contact with the contact layer 1411 in the inter-conductor region, and if there is no such possibility, a predetermined gas such as air or a vacuum may be used. Alternatively, a member having electrical conductivity and also having electrical resistivity higher than electrical resistivities of the central conductor 15D0, the ring-shaped conductor 15D1, and the connection conductor 15D2 may also be used as the high resistance portion.

Also in the present example, the connection conductor 15D2 is provided to cover the central conductor 15D0, the plurality of ring-shaped conductors 15D1, and the insulating film 15D3 in their entirety. Alternatively, the connection conductor 15D2 may be provided to partially cover the central conductor 15D0, the plurality of ring-shaped conductors 15D1, and the insulating film 15D3 as long as the connection conductor 15D2 has only to electrically connect the central conductor 15D0 to all the ring-shaped conductors 15D1.

As in the first to third embodiments, it is desirable that the second electrode 16 is equal to or wider than the first electrode 15D. In order to produce effects to be described later, the second electrode 16 may be narrower than the first electrode 15D.

When the two-dimensional photonic crystal surface emitting laser 10D of the fourth embodiment is used, one terminal of a power source (not shown) is connected to a part of the central conductor 15D0, the plurality of ring-shaped conductors 15D1, and the connection conductor 15D2 of the first electrode 15D, and the other terminal is connected to the second electrode 16. In addition to the above, applying a voltage between the first electrode 15D and the second electrode 16 by the power source injects a current into the active layer 11 from both electrodes. Here, since the central conductor 15D0, the plurality of ring-shaped conductors 15D1, and the connection conductor 15D2 are electrically connected to each other, current is injected into the active layer 11 from all the central conductor 15D0 and the ring-shaped conductors 15D1 through the contact layer 1411. On the other hand, since the insulating film 15D3 is provided in the inter-conductor region, no current is injected into the active layer 11 from the inter-conductor region. Then, since the ratio of the width of each ring-shaped conductor 15D1 to the width of the inter-conductor region decreases as the distance from the central conductor 15D0 increases, light emission having an intensity distribution with maximum at the center occurs in the charge injection region 111 of the active layer 11. This light emission is amplified in the two-dimensional photonic crystal layer 12, thereby facilitating laser oscillation in a fundamental mode. Therefore, useless laser oscillation in a higher mode can be reduced, thereby allowing the optical output power to be increased as a whole.

Thus, in the first electrode 15D, since one terminal of the power source has only to be connected to a part within a wide range including the central conductor 15D0, the plurality of ring-shaped conductors 15D1, and the connection conductor 15D2, the connection with the power source is easier than in the case of using the first electrode including the circular conductor 15B0, the plurality of ring-shaped conductors 15B1, and the linear conductor 15B3 of the second embodiment.

In the case where the connection conductor 15D2 covers the central conductor 15D0, the plurality of ring-shaped conductors 15D1, and the insulating film 15D3 in their entirety, the laser light directed toward the first electrode from the two-dimensional photonic crystal layer 12 can be reflected by the connection conductor 15D2 at almost uniform reflectivity. In addition, heat generated inside the two-dimensional photonic crystal surface emitting laser 10D is easily released from the connection conductor 15D2 to the outside.

Figure 18:
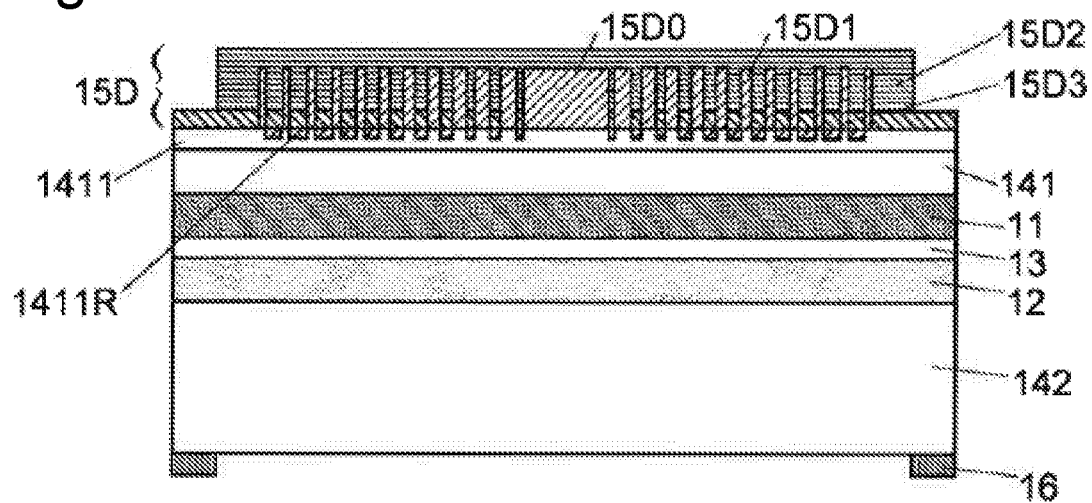
FIG. 18 is a sectional view showing a modification of the first electrode in the two-dimensional photonic crystal surface emitting laser of the fourth embodiment.

Furthermore, in the fourth embodiment, as shown in FIG. 18, the contact layer 1411 preferably has a high resistance region 1411R in a region facing the inter-conductor region (a region not overlapping with the central conductor 15D0 and the ring-shaped conductors 15D1). The high resistance region 1411R is a region where electrical conductivity is decreased (electrical resistivity is increased) as compared with other portions of the contact layer 1411 due to having impurities, and for example, can be formed by impurity ion implantation treatment using as a mask the central conductor 15D0 and the plurality of ring-shaped conductors 15D1. As the impurity ions to be implanted, hydrogen ions and/or oxygen ions can be suitably used. With this configuration, it is possible to prevent the current density distribution formed by the first electrode 15D from spreading in the in-plane direction before reaching the charge injection region 111 of the active layer 11. Therefore, a current density distribution that decreases as the distance from the center of the first electrode 15D increases can be more reliably formed.

As a modification of the fourth embodiment, as shown in FIGS. 19A to 19D, a multilayer reflective film 181 may be provided closer to the active layer 11 than the contact layer 1411 in the first cladding layer 141. The multilayer reflective film 181 has a structure in which a stacked body pair made of two types of semiconductor materials (for example, an $Al_xGa_{1-x}As$ layer and an $Al_yGa_{1-y}As$ layer (x>y. x=1 and/or y=0 may be satisfied)) having different refractive indexes is repeatedly stacked (about several to several tens of times) and has electrical conductivity. The multilayer reflective film 181 constitutes what is called a distributed Bragg reflector (DBR) and has a function of selectively reflecting light of a specific wavelength. With this configuration, fundamental mode laser oscillation can be more easily generated.

Figure 19A:
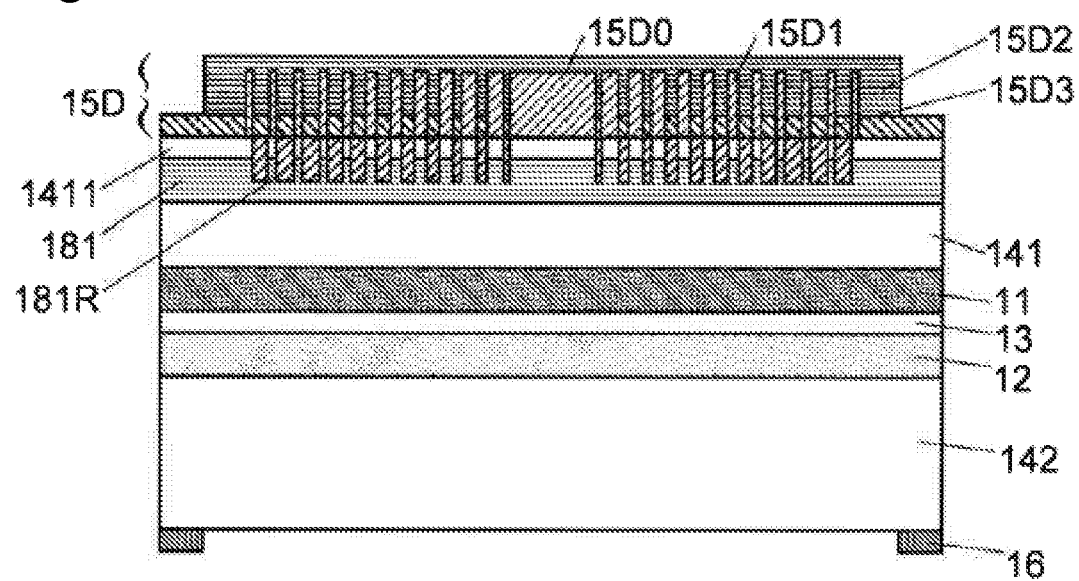
FIG. 19A is a sectional view showing another modification of the two-dimensional photonic crystal surface emitting laser of the fourth embodiment.
Figure 19B:
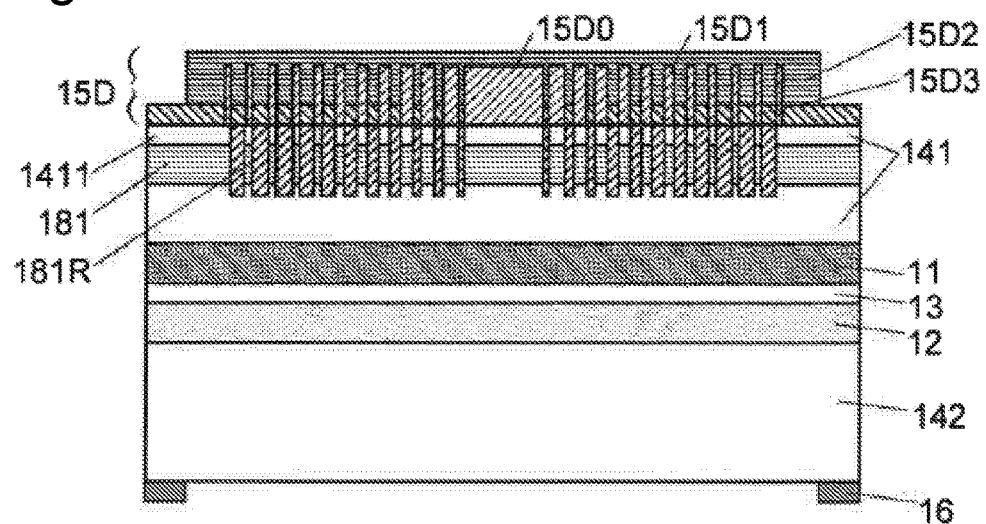
FIG. 19B is a sectional view showing still another modification of the two-dimensional photonic crystal surface emitting laser of the fourth embodiment.
Figure 19C:
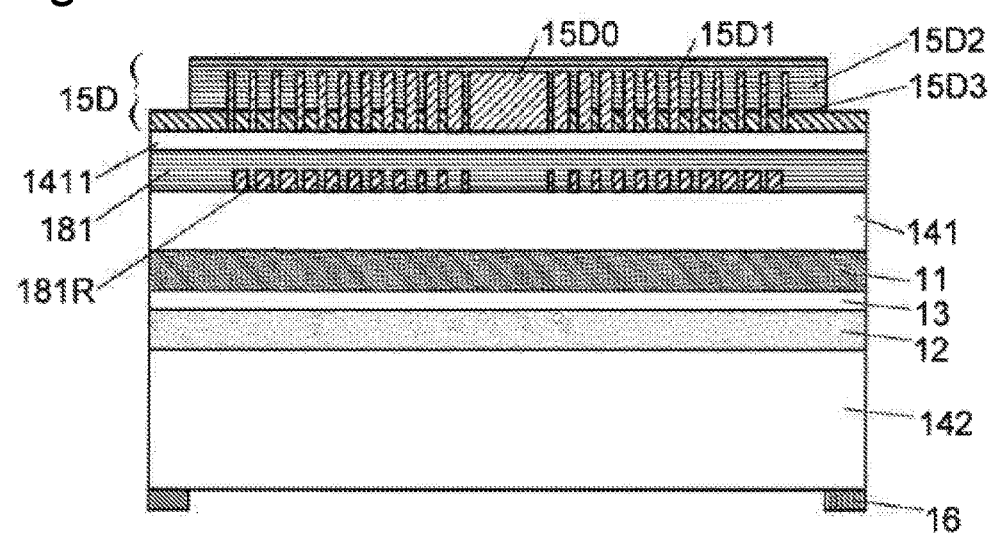
FIG. 19C is a sectional view showing yet another modification of the two-dimensional photonic crystal surface emitting laser of the fourth embodiment.
Figure 19D:
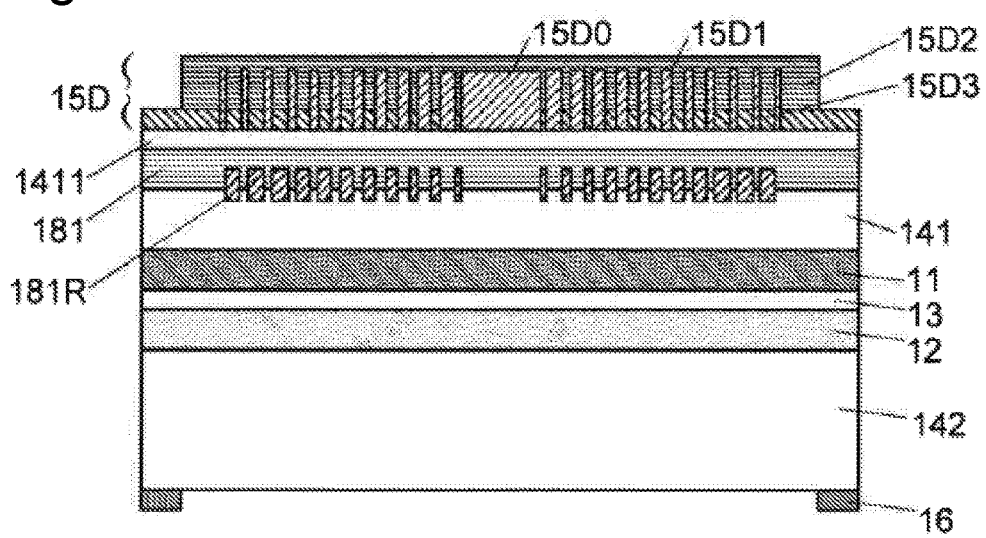
FIG. 19D is a sectional view showing yet another modification of the two-dimensional photonic crystal surface emitting laser of the fourth embodiment.

It is preferable that a high resistance region 181R having an electrical resistivity higher than that of the two kinds of semiconductor materials as the material of the multilayer reflective film 181 is provided in a region facing the inter-conductor region in the multilayer reflective film 181. The high resistance region 181R can be formed by impurity ion implantation treatment as with the high resistance region 1411R in the contact layer 1411 described above. The high resistance region 181R can be provided to extend from the contact layer 1411 to the multilayer reflective film 181 (FIG. 19A), or can be provided to extend from the contact layer 1411 to a part of the cladding layer 141 through the multilayer reflective film 181 (FIG. 19B). Alternatively, the multilayer reflective film 181 is subjected to impurity ion implantation treatment prior to the preparation of the contact layer 1411, so that the high resistance region 181R is not provided in the contact layer 1411, but can be provided only in the multilayer reflective film 181 (FIG. 19C), or can be provided to extend to a part of the cladding layer 141 through the multilayer reflective film 181 (FIG. 19D). Providing a high resistance region 181R in the multilayer reflective film 181 can prevent the current density distribution formed by the first electrode 15D from spreading in the in-plane direction before reaching the charge injection region 111 of the active layer 11, and can more reliably form the current density distribution that decreases as the distance from the center of the first electrode 15D increases. In the case of using only the function of selectively reflecting the light of the specific wavelength, the high resistance region 181R is not necessarily provided in the multilayer reflective film 181.

In the fourth embodiment and its modification shown so far, the central conductor 15D0 having a circular shape in a plan view is used, but the central conductor 15D0 may present any shape in a plan view (for example, a polygon such as a triangle, a quadrangle, or a hexagon). Similarly, the ring of the ring-shaped conductor 15D1 in a plan view may present any shape.

Fifth Embodiment—Concentric-Circular Electrode 3

Figure 20A:
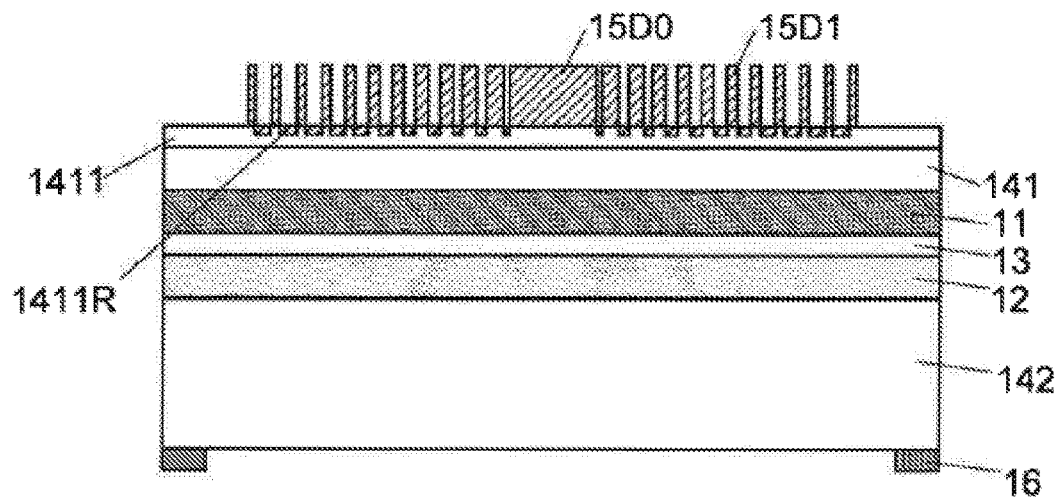
FIG. 20A is a sectional view showing a two-dimensional photonic crystal surface emitting laser of a fifth embodiment.
Figure 20B:
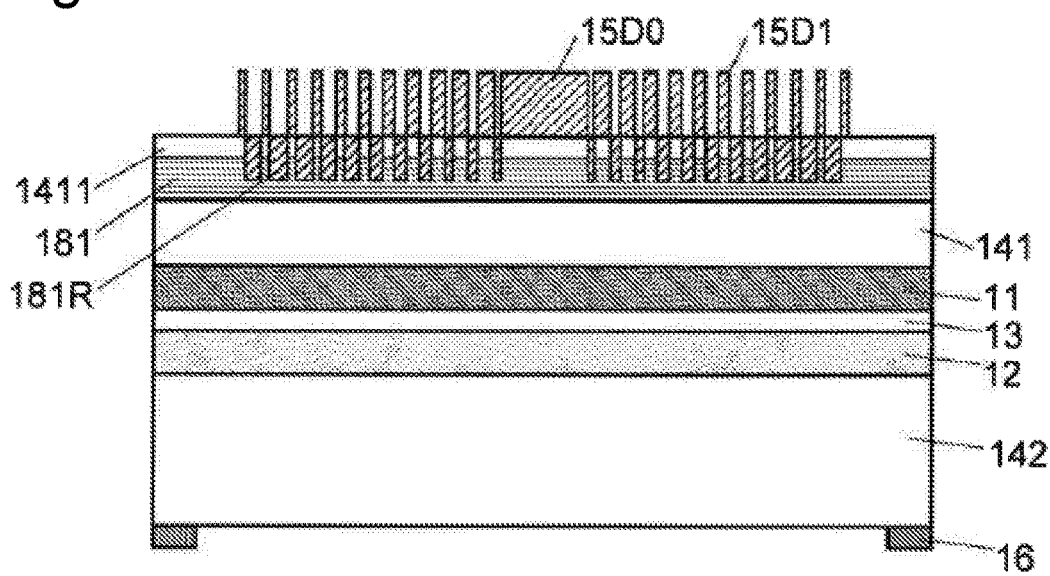
FIG. 20B is a sectional view showing a modification of the two-dimensional photonic crystal surface emitting laser of the fifth embodiment.

As described above, in the two-dimensional photonic crystal surface emitting laser 10D of the fourth embodiment, the central conductor 15D0 and the plurality of ring-shaped conductors 15D1 are electrically connected to each other by the connection conductor 15D2. Instead, the two-dimensional photonic crystal surface emitting laser may have a configuration where the connection conductor 15D2 and the insulating film 15D3 are eliminated from the configuration of the fourth embodiment, and when the two-dimensional photonic crystal surface emitting laser is mounted, the central conductor 15D0 and the plurality of ring-shaped conductors 15D1 may be electrically connected to each other by using solder or the like. FIG. 20A shows a configuration obtained by eliminating the connection conductor 15D2 and the insulating film 15D3 from the two-dimensional photonic crystal surface emitting laser shown in FIG. 18, and FIG. 20B shows a configuration obtained by eliminating the connection conductor 15D2 and the insulating film 15D3 from the two-dimensional photonic crystal surface emitting laser shown in FIG. 19A. The two-dimensional photonic crystal surface emitting laser may have a configuration obtained by eliminating the connection conductor 15D2 and the insulating film 15D3 from each of the two-dimensional photonic crystal surface emitting lasers shown in FIGS. 19B to 19D. Each of the configurations has the high resistance region 1411R provided in the contact layer 1411 and/or the high resistance region 181R provided in the multilayer reflective film 181. It is therefore possible to prevent the current density distribution formed by the first electrode 15D from spreading in the in-plane direction before reaching the charge injection region 111 of the active layer 11. It is also possible to form the current density distribution that decreases as the distance from the center of the first electrode 15D increases.

Figure 20C:
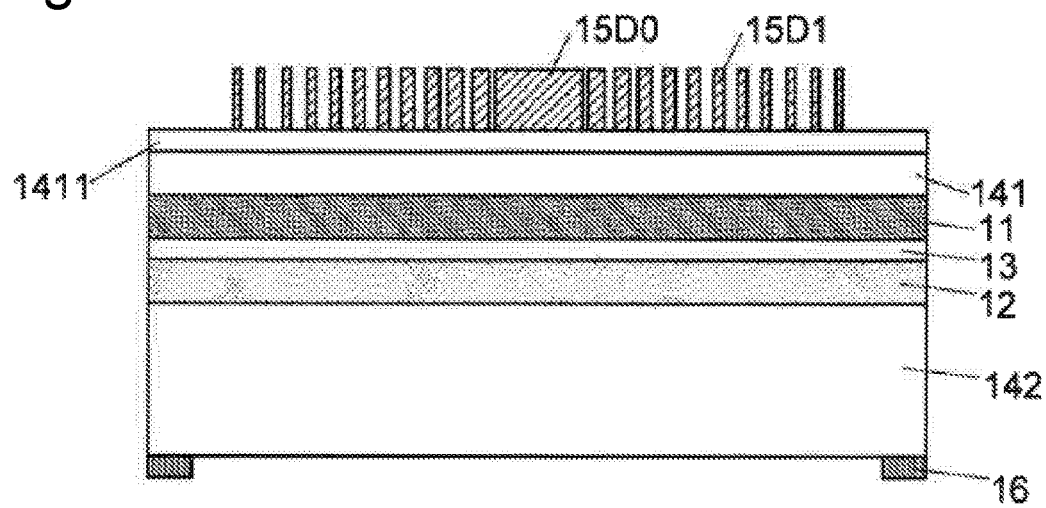
FIG. 20C is a sectional view showing a configuration obtained by omitting the connection conductor from the two-dimensional photonic crystal surface emitting laser of the fourth embodiment.

As shown in FIG. 20C, the two-dimensional photonic crystal surface emitting laser may also have a configuration obtained by eliminating the connection conductor 15D2 and the insulating film 15D3 from the two-dimensional photonic crystal surface emitting laser shown in FIGS. 17A and 17B. Also in this case, when the two-dimensional photonic crystal surface emitting laser is mounted, the central conductor 15D0 and the plurality of ring-shaped conductors 15D1 are electrically connected to each other by using solder or the like.

REFERENCE SIGNS LIST

10X . . . Two-Dimensional Photonic Crystal Surface Emitting Laser
11 . . . Active Layer
111 . . . Charge Injection Region
1111 . . . Central Part
1112 . . . Peripheral Part
12 . . . Two-Dimensional Photonic Crystal Layer
121 . . . Base Member
122 . . . Modified Refractive Index Regions
123 . . . Two-Dimensional Photonic Crystal
13 . . . Spacer Layer
141 . . . First Cladding Layer
1411 . . . Contact Layer
1411R . . . High Resistance Region Of Contact Layer
142 . . . Second Cladding Layer
15A, 15B, 15C, 15D, 15X . . . First Electrode
15A11, 15C11 . . . First Conductive Region
15A12, 15C12 . . . Second Conductive Region
15A13, 15C13 . . . Third Conductive Region
15A2 . . . Mesh Line
15A3 . . . Inter-Line Region
15B0 . . . Circular Conductor
15B1, 15D1 . . . Ring-Shaped Conductor
15B2 . . . Ring-Shaped Insulator
15B3 . . . Linear Conductor
15C21, 15C22 . . . Insulative Region
15C31, 15C32 . . . Connective Region
15D0 . . . Central Conductor
5D2 . . . Connection Conductor
15D3 . . . Insulating Film (High Resistance Portion)
16, 16A . . . Second Electrode
161A . . . Window
162A . . . Frame
181 . . . Multilayer Reflective Film
181R . . . High Resistance Region Of Multilayer Reflective Film

The invention claimed is:
1. A two-dimensional photonic crystal surface emitting laser comprising:
a two-dimensional photonic crystal including a plate-shaped base member and modified refractive index regions where the modified refractive index regions have a refractive index different from that of the plate-shaped base member and are two-dimensionally and periodically arranged in the base member;
an active layer provided on one side of the two-dimensional photonic crystal; and a first electrode and a second electrode provided sandwiching the two-dimensional photonic crystal and the active layer for supplying current through a contact layer having electrical conductivity to the active layer, wherein the first electrode includes:
  a central conductor in direct contact with the contact layer,
  a plurality of ring-shaped conductors in direct contact with the contact layer, the plurality of ring-shaped conductors arranged concentrically around the central conductor,
  a high resistance portion provided in an inter-conductor region which is composed of a region between the central conductor and a ring-shaped conductor arranged innermost among the plurality of ring-shaped conductors, and a region between adjacent ring-shaped conductors in the plurality of ring-shaped conductors, and
  a connection conductor entirely covering the central conductor, the plurality of ring-shaped conductors, and the high resistance portion and provided on an opposite side from the contact layer in the first electrode, so as to electrically connect the central conductor to all the plurality of ring-shaped conductors, and
wherein the high resistance portion has electrical resistivity higher than electrical resistivities of the central conductor, the plurality of ring-shaped conductors, and the connection conductor.

2. The two-dimensional photonic crystal surface emitting laser according to claim 1, wherein, in a region facing the inter-conductor region, the contact layer has a high resistance region having electrical resistivity higher than electrical resistivity of another portion of the contact layer.

3. The two-dimensional photonic crystal surface emitting laser according to claim 1, further comprising a multilayer reflective film made of two kinds of films alternately stacked with different refractive indexes between the first electrode and the active layer, the multilayer reflective film having electrical conductivity, and
  wherein, in a region facing the inter-conductor region, the multilayer reflective film has a high resistance region having electrical resistivity higher than electrical resistivity of another portion of the multilayer reflective film.

4. The two-dimensional photonic crystal surface emitting laser according to claim 1, wherein the high resistance portion is made of an insulator.

5. A two-dimensional photonic crystal surface emitting laser comprising:
  a two-dimensional photonic crystal including a plate-shaped base member and modified refractive index regions where the modified refractive index regions have a refractive index different from that of the plate-shaped base member and are two-dimensionally and periodically arranged in the base member;
  an active layer provided on one side of the two-dimensional photonic crystal; and
  a first electrode and a second electrode provided sandwiching the two-dimensional photonic crystal and the active layer for supplying current through a contact layer having electrical conductivity to the active layer, wherein the first electrode includes:
    a central conductor in direct contact with the contact layer, and
    a plurality of ring-shaped conductors in direct contact with the contact layer, the plurality of ring-shaped conductors arranged concentrically around the central conductor, and
  wherein the contact layer has a high resistance region having electrical resistivity higher than electrical resistivity of another portion of the contact layer, in a region facing an inter-conductor region which is composed of a region between the central conductor and a ring-shaped conductor arranged innermost among the plurality of ring-shaped conductors, and in a region facing between adjacent ring-shaped conductors in the plurality of ring-shaped conductors, and wherein the high resistance region is not located in a region overlapping the first electrode.

6. A two-dimensional photonic crystal surface emitting laser comprising:
  a two-dimensional photonic crystal including a plate-shaped base member and modified refractive index regions where the modified refractive index regions have a refractive index different from that of the plate-shaped base member and are two-dimensionally and periodically arranged in the base member;
  an active layer provided on one side of the two-dimensional photonic crystal; and
  a first electrode and a second electrode provided sandwiching the two-dimensional photonic crystal and the active layer for supplying current through a contact layer having electrical conductivity to the active layer, wherein the first electrode includes:
    a central conductor in direct contact with the contact layer, and
    a plurality of ring-shaped conductors in direct contact with the contact layer, the plurality of ring-shaped conductors arranged concentrically around the central conductor,
  the two-dimensional photonic crystal surface emitting laser further comprising
  a multilayer reflective film made of two kinds of films alternately stacked with different refractive indexes between the first electrode and the active layer, the multilayer reflective film having electrical conductivity,
  wherein the multilayer reflective film has a high resistance region having electrical resistivity higher than electrical resistivity of another portion of the multilayer reflective film, in a region facing an inter-conductor region which is composed of a region between the central conductor and a ring-shaped conductor arranged innermost among the plurality of ring shaped conductors, and in a region facing between adjacent ring-shaped conductors in the plurality of ring-shaped conductors, and wherein the high resistance region is not located in a region overlapping the first electrode.

* * * * *